United States Patent
Yang et al.

(10) Patent No.: US 9,196,765 B2
(45) Date of Patent: Nov. 24, 2015

(54) NANOSTRUCTURED SOLAR CELL

(71) Applicants: Shuqiang Yang, Austin, TX (US); Michael N. Miller, Austin, TX (US); Mohamed M. Hilali, Austin, TX (US); Fen Wan, Austin, TX (US); Gerard M. Schmid, Austin, TX (US); Liang Wang, Austin, TX (US); Sidlgata V. Sreenivasan, Austin, TX (US); Frank Y. Xu, Round Rock, TX (US)

(72) Inventors: Shuqiang Yang, Austin, TX (US); Michael N. Miller, Austin, TX (US); Mohamed M. Hilali, Austin, TX (US); Fen Wan, Austin, TX (US); Gerard M. Schmid, Austin, TX (US); Liang Wang, Austin, TX (US); Sidlgata V. Sreenivasan, Austin, TX (US); Frank Y. Xu, Round Rock, TX (US)

(73) Assignee: MOLECULAR IMPRINTS, INC.; BOARD OF REGENTS, THE UNIVERSITY OF TEXAS SYSTEM, Austin, TX (US)

( * ) Notice: Subject to any disclaimer, the term of this patent is extended or adjusted under 35 U.S.C. 154(b) by 0 days.

(21) Appl. No.: 14/716,233

(22) Filed: May 19, 2015

(65) Prior Publication Data

US 2015/0255640 A1    Sep. 10, 2015

Related U.S. Application Data

(62) Division of application No. 13/105,422, filed on May 11, 2011, now Pat. No. 9,070,803.

(60) Provisional application No. 61/447,226, filed on Feb. 28, 2011, provisional application No. 61/333,622, filed on May 11, 2010.

(51) Int. Cl.
*H01L 31/0236* (2006.01)
*C23C 14/34* (2006.01)
*H01L 31/20* (2006.01)

(52) U.S. Cl.
CPC .......... *H01L 31/02363* (2013.01); *C23C 14/34* (2013.01); *H01L 31/202* (2013.01)

(58) Field of Classification Search
CPC ................... H01L 31/022466; H01L 31/0236; H01L 31/035263; H01L 31/035281; H01L 31/0463; H01L 31/0392; H01L 31/075; H01L 31/076; H01L 31/202; H01L 31/03762; H01L 31/02363; C23C 14/34; B82Y 20/00
See application file for complete search history.

(56) References Cited

U.S. PATENT DOCUMENTS

| | | | |
|---|---|---|---|
| 5,782,993 A * | 7/1998 | Ponewash | 136/251 |
| 6,873,087 B1 | 3/2005 | Choi et al. | |
| 6,932,934 B2 | 8/2005 | Choi et al. | |
| 6,936,194 B2 | 8/2005 | Watts | |
| 7,077,992 B2 | 7/2006 | Sreenivasan et al. | |
| 7,157,036 B2 | 1/2007 | Choi et al. | |

(Continued)

FOREIGN PATENT DOCUMENTS

WO     WO 2008/012516     *  1/2008     .............. H01L 31/07

OTHER PUBLICATIONS

Xie et al., "Semiconductor Surface Roughness: Dependence on Sign and Magnitude of Bulk Strain," Phys. Rev. Lett. vol. 73, No. 22, pp. 3006-3009, Nov. 28, 1994.

(Continued)

*Primary Examiner* — Alexander Kollias
(74) *Attorney, Agent, or Firm* — Fish & Richardson P.C.

(57) ABSTRACT

Systems and methods for fabrication of nanostructured solar cells having arrays of nanostructures are described, including nanostructured solar cells having a repeating pattern of pyramid nanostructures, providing for low cost thin-film solar cells with improved PCE.

14 Claims, 17 Drawing Sheets

(56) References Cited

U.S. PATENT DOCUMENTS

| | | |
|---|---|---|
| 7,179,396 B2 | 2/2007 | Sreenivasan |
| 7,339,110 B1 | 3/2008 | Mulligan et al. |
| 7,396,475 B2 | 7/2008 | Sreenivasan |
| 2004/0065252 A1 | 4/2004 | Sreenivasan et al. |
| 2004/0065976 A1 | 4/2004 | Sreenivasan et al. |
| 2005/0187339 A1 | 8/2005 | Xu et al. |
| 2007/0111368 A1 | 5/2007 | Zhang et al. |
| 2007/0204902 A1 | 9/2007 | Dutta |
| 2009/0139571 A1 | 6/2009 | Chen et al. |
| 2010/0282314 A1 | 11/2010 | Coakley et al. |
| 2011/0183521 A1 | 7/2011 | Schmid et al. |

OTHER PUBLICATIONS

Vocabulary.com—Definition of Undulate, pp. 1-2, obtained online from: http://www.vocabulary.com/dictionary/undulate, no publication date given.

Merriam-Webster.com, "Pattern," pp. 1-4, no publication date give, obtained online from: http://www.merriamwebster.com/dictionary/pattern.

Tucci et al., "CF4/02 dry etching of textured crystalline silicon surface in a-Si:H/c-Si heterojunction for photovoltaic applications," Solar Energy Materials and Solar Cells, vol. 69, Issue 2, Sep. 2001, pp. 175-185.

Python et al., "Relation between substrate surface morphology and microcrystalline silicon solar cell performance," Journal of Non-Crystalline Solids, vol. 354, Issues 19-25, pp. 2258-2262, May 2008.

Python et al., "Influence of the substrate geometrical parameters on microcrystalline silicon growth for thin-film solar cells," Solar Energy Materials and Solar Cells, vol. 94, Issue 10, pp. 1714-1720 Oct. 2009.

Olibet et al., "Modification of textured silicon wafer surface morphology for fabrication of heterojunction solar cell with open circuit voltage over 700 mV," Photovoltaic Specialists Conference (PVSC), 2009 34th IEEE, pp. 000754-000758, Jun. 7-12, 2009.

Hilali et al., "Enhanced photocurrent in thin-film amorphous silicon solar cells via shape controlled three-dimensional nanostructures," Nanotechnology, vol. 23, No. 40, pp. 1-9, Sep. 20, 2012.

Fontcuberta I Morral et al., Structure and hydrogen content of polymorphous silicon thin films studied by spectroscopic ellipsometry and nuclear measurements; Physical Review B 69,125307-1 to 125307-10; Mar. 10, 2004.

Liao et al,. Impacts of nano-structures in p- and i-layer on the performances of amorphous silicon solar cells; Phys. Status Solidi C, 6, No. 3, 696-699; Jan. 1, 2009.

Pei et al., Numerical Simulation on the Photovoltaic Behavior of an Amorphous-Silicon Nanowire-Arry Solar Cell; IEEE Electron Device Letters vol. 30, No. 12 1305-1307; Dec. 1, 2009.

Shih et al., Improvement of the light-trapping effect using a subwavelength-structured optical disk; Applied Optics vol. 48, No. 25, F49-F54; Jun. 23, 2009.

Fan et al., Three-dimensional nanopillar-array photovoltaics on low-cost and flexible substrates; Nature Materials vol. 8 (Aug. 2009) 648-653; Jul. 5, 2009.

Li et al., Photochemical Etching of GaAs with Cl2 Induced by Synchrotrin Radiation; Appl. Phys. A 57, 457-467; Aug. 9, 1993.

Streller et al., Reaction products in synchrotron radiation induced dry etching of Ga and Cu; Applied Surface Science 109/110 (1197) 442-448; Sep. 2, 1996.

Streller et al., High efficiency in dry etching of Si for wavelengths around 120 nm; Appl. Phys. Lett. vol. 69 No. 20 pp. 3004-3006; Nov. 11, 1996.

* cited by examiner

NANOSTRUCTURED SOLAR CELL

CROSS REFERENCE TO RELATED APPLICATIONS

This application is a divisional application of and claims priority to U.S. patent application Ser. No. 13/105,422, filed on May 11, 2011, now U.S. Pat. No. 9,070,803 which claims priority to U.S. Provisional Application No. 61/333,622 filed May 11, 2010 and to U.S. Provisional Application No. 61/447,226 filed Feb. 28, 2011, the entire contents of which are hereby incorporated by reference.

BACKGROUND INFORMATION

Nano-fabrication includes the fabrication of very small structures that have features on the order of 100 nanometers or smaller. One application in which nano-fabrication has had a sizeable impact is in the processing of integrated circuits. The semiconductor processing industry continues to strive for larger production yields while increasing the circuits per unit area formed on a substrate; therefore nano-fabrication becomes increasingly important. Nano-fabrication provides greater process control while allowing continued reduction of the minimum feature dimensions of the structures formed. Other areas of development in which nano-fabrication has been employed include photovoltaic cells, biotechnology, optical technology, mechanical systems, and the like.

An exemplary nano-fabrication technique in use today is commonly referred to as imprint lithography. Exemplary imprint lithography processes are described in detail in numerous publications, such as U.S. Patent Publication No. 2004/0065976, U.S. Patent Publication No. 2004/0065252, and U.S. Pat. No. 6,936,194, all of which are hereby incorporated by reference herein in their entirety.

An imprint lithography technique disclosed in each of the aforementioned U.S. patent publications and patent includes formation of a relief pattern in a formable (polymerizable) layer and transferring a pattern corresponding to the relief pattern into an underlying substrate. The substrate may be coupled to a motion stage to obtain a desired positioning to facilitate the patterning process. The patterning process uses a template spaced apart from the substrate and a formable liquid applied between the template and the substrate. The formable liquid is solidified to form a rigid layer that has a pattern conforming to a shape of the surface of the template that contacts the formable liquid. After solidification, the template is separated from the rigid layer such that the template and the substrate are spaced apart. The substrate and the solidified layer are then subjected to additional processes to transfer a relief image into the substrate that corresponds to the pattern in the solidified layer.

BRIEF DESCRIPTION OF DRAWINGS

So that features and advantages of the present invention can be understood in detail, a more particular description of embodiments of the invention may be had by reference to the embodiments illustrated in the appended drawings. It is to be noted, however, that the appended drawings only illustrate typical embodiments of the invention, and are therefore not to be considered limiting of its scope, for the invention may admit to other equally effective embodiments.

DETAILED DESCRIPTION

Figure 1:
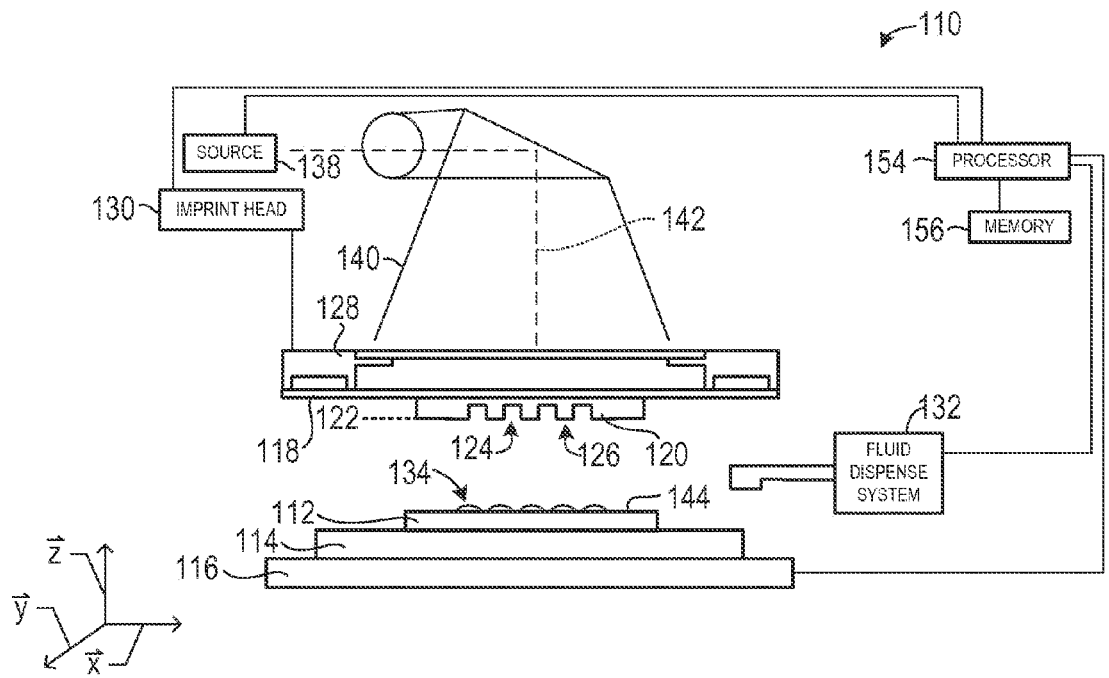
FIG. 1 illustrates a simplified side view of an exemplary imprint lithography system

When compared with crystalline silicon (C-Si) in photovoltaic modules, thin film amorphous silicon (e.g., a-Si) has a low cost and is generally compatible with roll-to-roll processing (i.e., web processing). A-Si based solar cells, however, generally suffer from relatively low power conversion efficiency (PCE). For example, currently, a-Si based solar cells may have a practical number between approximately 4.5 to 8.5% conversion efficiency. A PCE of greater than approximately 10% is generally needed in order to compete with commercially available solar cells (e.g., C-Si, GaAs, and the like). Additionally, currently designed a-Si based solar cells are less stable than commercial C-Si solar cells.

While thin-film silicon solar cells may be cost effective, they may have relatively low efficiency, and/or low deposition rates. As such, formation may include long lag times in order to deposit even 1 μm films. Further, thin-film silicon solar cells may only achieve efficiency values of approximately 10%. For production modules, this efficiency may be even further reduced based on numerous practical reduction factors. Therefore, the current practical efficiency values may be only approximately 6-7%.

Several resources indicate that the ability to provide nanostructured materials at a reasonable cost may significantly enhance the efficiency of solar cells. This concept is discussed in: Fontcuberta i Morral, A., P. Roca i Cabarrocas, et al. "Structure and hydrogen content of polymorphous silicon thin films studied by spectroscopic ellipsometry and nuclear measurements," *Physical Review B Condensed Matter and Materials Physics* 69(12): 125307/1-125307/10 (2004); Liao, X., W. Du, et al. "Impacts of nano-structures in p- and i-layer on the performances of amorphous silicon solar cells," *Physica Status Solidi C Current Topics in Solid State Physics* 6(3): 696-699 (2009); Pei, Z., S.-T. Chang, et al. "Numerical simulation on the photovoltaic behavior of an amorphous-silicon nanowire-array solar cell," *IEEE Electron Device Letters* 30(12): 1305-1307 (2009); and Shih, H.-F., S.-J. Hsieh, et al. "Improvement of the light-trapping effect using a sub-wavelength-structured optical disk," *Applied Optics* 48(25): F49-F54, (2009), which are hereby incorporated by reference in their entirety.

Nanostructures may decrease travel distance of excitons, while providing sufficient light absorption. Moreover, an a-Si layer with nanostructures may have higher stability. See Fontcuberta. Use of a thin a-Si layer may also reduce deposition time and/or costs.

Currently within the art, there are different approaches for providing a nanostructured solar cell. For example, Solasta, Inc. provided fabricated nanopillar arrays having PCE of approximately 10% (http://www.technologyreview.com/energy/24547/page1/). Solasta, Inc. used microsphere lithography, forming a pattern of catalyst metal (Nickel), and depositing carbon nanotube (CNT) on top. This method, however, lacked control in pillar size and was generally tedious to perform. In another example, Fan et al. grow nanopillars on aluminum substrates. See Fan et al. "Three-dimensional nanopillar-array photovoltaics on low-cost and flexible substrates," *Nature Materials*, Vol. 8, 648-653 (2009), which is hereby incorporated by reference in its entirety. Aluminum templates were obtained by anodization. These methods, however, are often costly, dimensions of nanostructures may be difficult to control, and/or interfaces between layers tend to be poor, resulting in lower PCE as compared with flat solar cells. As a result, growing a nanopillar array is too expensive for fabrication as compared to commercially viable solar cells.

Figure 2A:
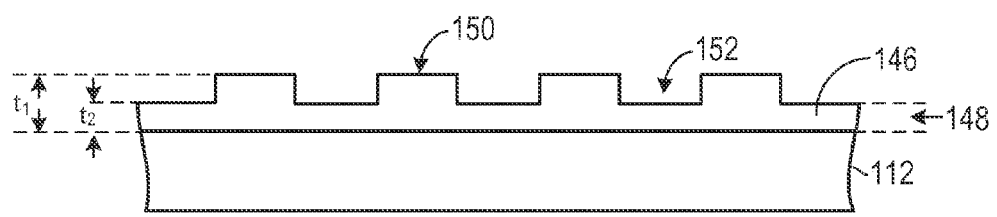
FIG. 2A illustrates a simplified side view of the substrate illustrated in FIG. 1, having a patterned layer with nanostructures thereon.
Figure 2B:
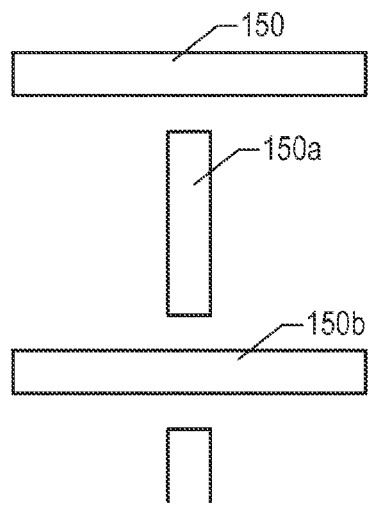
FIGS. 2B-2E illustrate top-down views of exemplary embodiments of nanostructures.
Figure 2C:
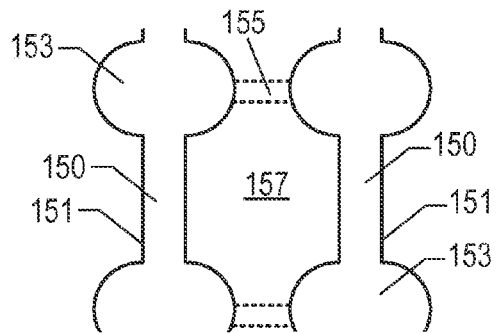
Figure 2D:
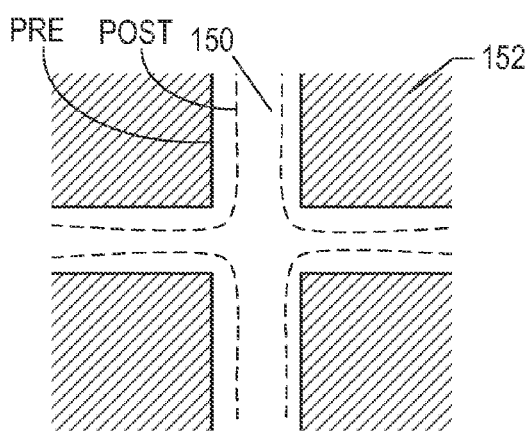
Figure 2E:
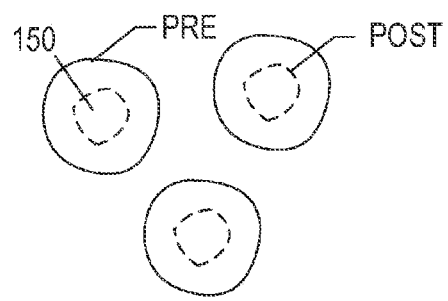
Figure 3:
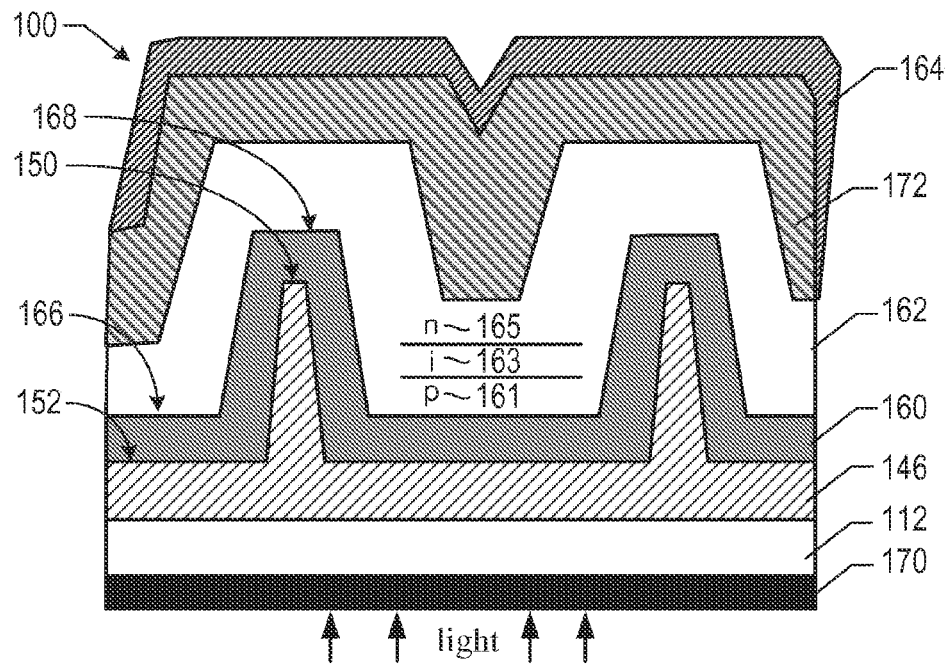
FIGS. 3-6 illustrate simplified side views of exemplary embodiments of nanostructured solar cells formed in accordance with the present invention.

Referring to FIGS. 1-3, a nanostructured solar cell 100 may be fabricated providing low cost at a high PCE using nanoimprint lithography providing a low cost option with greater stability. Generally, fabrication of nanostructured solar cell 100 may include low-viscosity UV-curable imprinting fluids and/or drop-on-demand fluid dispensing. Selection of fluid and fluid volume may be based on pattern density of an imprinting template 118. Imprinting template 118 may form a patterned surface 146, providing nanostructures 150 and 152 formed of formable material 134. A-Si may then be deposited on nanostructures 150 and 152. Nanostructures 150 and 152 may increase the surface area contact. Nanostructures 150 and 152 may also be designed to favor light trapping, which may increase absorption while maintaining a relatively small travel distance for excitons.

Referring to FIGS. 1 and 2, lithographic system 110 may be used to form a relief pattern on substrate 112. Substrate 112 may be formed of hard transparent material, including but not limited to Polyethylene terephthalate (PET), Polyethylene naphthalate (PEN), and/or the like.

Substrate 112 may be coupled to substrate chuck 114. As illustrated, substrate chuck 114 is a vacuum chuck. Substrate chuck 114, however, may be any chuck including, but not limited to vacuum, pin-type, groove-type, electrostatic, electromagnetic, and/or the like. Exemplary chucks are described in U.S. Pat. No. 6,873,087, which is incorporated by reference herein.

Substrate 112 and substrate chuck 114 may be further supported by stage 116. Stage 116 may provide translational and/or rotational motion along the x, y, and z-axes. Stage 116, substrate 112, and substrate chuck 114 may also be positioned on a base (not shown).

Spaced-apart from substrate 112 is template 118. Template 118 may include a body having a first side and a second side, with one side having a mesa 120 extending therefrom towards substrate 112. Mesa 120 may have a patterning surface 122 thereon. Further, mesa 120 may be referred to as mold 120. Alternatively, template 118 may be formed without mesa 120.

Template 118 and/or mold 120 may be formed from such materials including, but not limited to, fused-silica, quartz, silicon, organic polymers, siloxane polymers, borosilicate glass, fluorocarbon polymers, metal, hardened sapphire, and/or the like. As illustrated in FIG. 1, patterning surface 122 comprises features defined by a plurality of spaced-apart recesses 124 and/or protrusions 126, though embodiments of the present invention are not limited to such configurations. Patterning surface 122 may define any original pattern that forms the basis of a pattern to be formed on substrate 112.

Template 118 may be coupled to chuck 128. Chuck 128 may be configured as, but not limited to, vacuum, pin-type, groove-type, electrostatic, electromagnetic, and/or other similar chuck types. Exemplary chucks are further described in U.S. Pat. No. 6,873,087, which is hereby incorporated by reference herein. Further, chuck 128 may be coupled to imprint head 130 such that chuck 128 and/or imprint head 130 may be configured to facilitate movement of template 118.

System 110 may further comprise a fluid dispense system 132. Fluid dispense system 132 may be used to deposit formable material 134 (e.g., polymerizable material) on substrate 112. Formable material 134 may be positioned upon substrate 112 using techniques such as drop-dispense, spin-coating, dip-coating, chemical vapor deposition (CVD), physical vapor deposition (PVD), thin film deposition, thick film deposition, and/or the like. Drop-dispense through drop-on-demand may enable imprinting of variable pattern densities while minimizing chemical and mechanical waste. Additionally, no specialized, double-sided spin-coater is required. Drop-dispense through drop-on-demand is generally considered cleaner than spin-on type deposition. Further, drop-on-demand enables a very thin and substantially uniform residual layer thickness as described in further detail herein.

Formable material 134 may be disposed upon substrate 112 before and/or after a desired volume is defined between mold 122 and substrate 112 depending on design considerations. Formable material 134 may be functional nano-particles having use within the solar cell industry, and/or other industries requiring a functional nano-particle. In one example, formable material 134 may comprise a monomer mixture as described in U.S. Pat. No. 7,157,036 and U.S. Patent Publication No. 2005/0187339, both of which are herein incorporated by reference. Alternatively, formable material 134 may include, but is not limited to, solar cell materials, and/or the like.

Referring to FIGS. 1 and 2, system 110 may further comprise energy source 138 coupled to direct energy 140 along path 142. Imprint head 130 and stage 116 may be configured to position template 118 and substrate 112 in superimposition with path 142. System 110 may be regulated by processor 154 in communication with stage 116, imprint head 130, fluid dispense system 132, and/or source 138, and may operate on a computer readable program stored in memory 156.

Either imprint head 130, stage 116, or both vary a distance between mold 120 and substrate 112 to define a desired volume therebetween that is filled by formable material 134. For example, imprint head 130 may apply a force to template 118 such that mold 120 contacts formable material 134. After the desired volume is filled with formable material 134, source 138 produces energy 140, e.g., ultraviolet radiation, causing formable material 134 to solidify and/or cross-link, conforming it to a shape on surface 144 of substrate 112 and patterning surface 122, defining patterned layer 146 on substrate 112. Patterned layer 146 may comprise a residual layer 148 and nanostructures 150 and 152, with nanostructures 150 having a thickness $t_1$ and residual layer having a thickness $t_2$.

Nanostructures 150 and 152 may vary in size and/or have varying shapes including, but not limited to, lines pillars, holes, pyramids or any fanciful shape. Feature heights may generally be at least approximately 100 nm, or at least approximately 500 nm, or at least approximately 1 µm.

Nanostructures within the industry tend to be formed of carbon nanotubes or pillars and the like, and as such are complex structures that are generally costly to provide. Nanoimprint lithography, however, provides flexibility at low cost, providing the ability to optimize the shape of nanostructures. To that end, the design of nanostructures 150 and 152 size and shape may be configured to optimize solar cell 100. Configuration of size and shape may be based on (1) selection of pitch, shape and aspect ratio to maximize the volume of a-Si for a given depth of nanostructures 150 and/or 152; (2) maximizing light trapping; and/or (3) maximizing stability prior to and subsequent to etching processes.

FIGS. 2B-2E illustrate exemplary embodiments of nanostructures 150 and 152 for use in solar cell 100. Referring to FIG. 2B, illustrated therein are nanostructures 150a and 150b that may be formed in lines. Length and arrangement of lines 150a and 150b (e.g., pattern) may provide stability. For example, line 150a and line 150b may be substantially similar in dimensions and positioned at angles relative to each other. As illustrated, line 150a is positioned at a 90 degree angle relative to line 150b. Although a 90 degree angle is shown, lines 150a and 150b may be positioned at any angle configured to provide stability.

Referring to FIG. 2C, nanostructures 150 may include an extended portion 151 and a pillar formation 153. Extended portion 151 may be a substantially straight line formation interconnecting pillars 153. Optionally, a line 155 may interconnect adjacent pillars 153 forming a box pattern 157 between extended portion 151, pillars 153 and line 155. Line 155 may have dimensions substantially smaller than extended portion 151.

Feature size of nanostructures 150 and 152 may be pre-biased based on a predicted decreased in size during etching processes. For example, FIG. 2D illustrates a cross pattern formation of nanostructure 150 as PRE-etching and POST-etching. Nanostructures 150 may be pre-biased to account for this decrease. Similarly, nanostructures 150 in pillar formations, as illustrated in FIG. 2E, may be pre-biased to account for size decrease during etching as described in further detail herein.

The above-mentioned system and process may be further employed in the imprint lithography processes and systems referred to in U.S. Pat. No. 6,932,934, U.S. Pat. No. 7,077, 992, U.S. Pat. No. 7,179,396, and U.S. Pat. No. 7,396,475, all of which are hereby incorporated by reference in their entirety. A roll-to-roll process may be developed by limited variation of the process and tools. The imprinting stage can be incorporated into a roll-to-roll system when using flexible substrate, where the substrate is unwrapped from one roll, followed by patterned by imprinting, and, finally, wrapped onto another roll. Roll-to-roll processing is high throughput and operable at reduced cost.

Referring to FIG. 3, subsequent to formation of nanostructures 150 and 152 on substrate 112, a transparent conducting oxide layer (TCO layer) 160 may be positioned on patterned layer 146. TCO layer 160 may be deposited by evaporation, CVD, sputtering, or the like.

TCO layer 160 may be formed of materials including, but not limited to, indium tin oxide, zinc oxide, tin dioxide, and/or the like. Generally, qualifying materials for TCO layer 160 include materials having a high conductivity balanced with transparency to sunlight. TCO layer 160 generally includes low sheet resistivity, e.g., approximately 100 ohm/sq or less. Thickness of TCO layer 160 may be within the range of approximately 50 nm to 500 nm. Deposition of TCO layer 160 on patterned layer 146 forms a front electrode.

An active layer 162 may be deposited on TCO layer 160. Active layer 162 may be a three-layer (p-i-n) of a-Si: a-Si p-layer 161, a-Si intrinsic layer 163, a-Si n-layer 165. Active layer 162 may be deposited by PECVD, LPCVD, HWCVD, or the like. Generally, active layer 162 may be deposited at temperature of approximately 200° C. or a temperature lower than degradation temperature of underneath patterned materials.

Underlying nanostructures 150 and 152 of patterned layer 146 may eliminate the general tradeoff between "thick" and "thin" in thin-film solar cell design and separate the electrons' path from the photons' path. For example, the thicker active layer 162 is, the more incident light may be collected, and the more free electrons may be generated. With increasing thickness, however, fewer free electrons may be efficiently transferred out. Positioning and design of nanostructures 150 and 152 as described herein provides an increased surface area while minimizing the distance for free electrons to be transferred out.

Further, degradation of a-Si may depend on thickness of the intrinsic layer 163. For example, a solar cell with a thickness of 100 nm or less generally does not have significant degradation compared with one of thicker caliber. To that end, thickness of intrinsic layer 163 may be configured to be in the range of approximately 80 nm-200 nm, p-layer 161 may be configured to be in the range of approximately 5 nm-20 nm, and n-layer 165 may be configured to be in the range of approximately 5 nm-40 nm.

Design of patterned layer 146 may be configured to provide a high aspect ratio increasing absorbing capabilities of active layer 162 while maintaining deposition thickness. Aspect ratio may be between 1 to 3 or it may be between 1 to 10 or more. In one example, height of nanostructures 150 may be in the range between approximately 300 nm-1000 nm or more.

In another example, pitch may be between approximately 500 nm-2 μm or more, with nanostructures 150 having a width of 25 nm to 300 nm or larger.

A back reflective layer 164 may be deposited on active layer 162, forming nanostructured solar cell 100. Back reflective layer 164 may be formed of materials including, but not limited to, aluminum, silver, and/or the like. Generally, qualifying materials for back reflective layer 164 include materials having high reflectivity and conduction. Back reflective layer 164 may be deposited using techniques including evaporation, sputtering, CVD and the like.

The thickness of back reflective layer 164 may be configured to provide good conductivity, e.g., within a range of 30 nm to 200 nm or more. Additionally, thickness of back reflective layer 164 may be designed to provide protection of solar cell 100 during environmental attack. Back reflective layer 164 may reflect light to active layer 162. Additionally, back reflective layer 164 may trap light having a distinct wavelength range through plasmonic effects, corresponding to size and/or shape of its surface textures.

An antireflection layer 170 may optionally be positioned adjacent to substrate 112 (e.g., deposited on substrate 112). Anti-reflection layer 170 may be formed of materials having anti-reflection properties, while being transparent to incident light. The thickness of antireflection layer 170 may be between approximately 10 nm to 200 nm.

A buffer layer 172 (e.g., zinc oxide) may be positioned directly opposite antireflection layer 170 on solar cell 100 as illustrated in FIG. 3. For example, buffer layer 172 may be positioned between back electrode 164 and active layer 162. Thickness of buffer layer 172 may be configured to be thin enough for Plasmonic effects of contacting metal and induced stress involving the film, yet thick enough to sufficiently block the holes (e.g., between approximately 30 nm-500 nm). Buffer layer 172 may aid in the collection of electrons and prevent atom diffusions between 164 and 162. Additionally, a second buffer layer (e.g., μc-Si) may be deposited in addition to the a-Si p-layer to aid in collection of holes.

Figure 4:
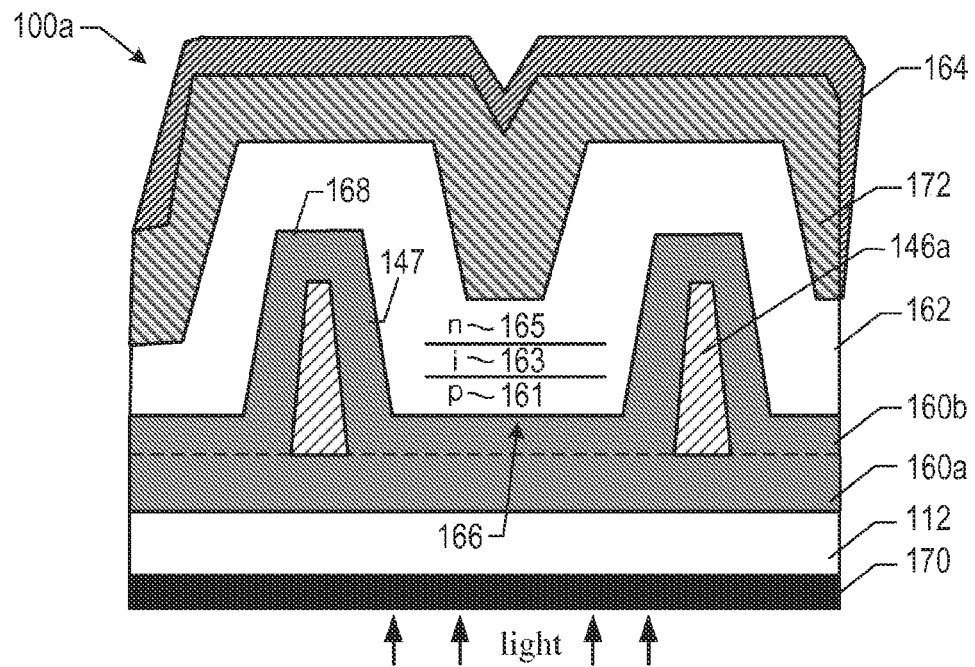

FIG. 4 provides a variation of nanostructured solar cell 100 shown in FIG. 3, illustrated as nanostructured solar cell 100a. Nanostructured solar cell 100a may have more active material as compared with the same patterned layer 146a. Generally, a first TCO layer 160a may be deposited on substrate 112. Patterned layer 146a may be formed on first TCO layer 160a using methods and systems described in relation to FIGS. 1-2. Recessed areas 166 of patterned layer 146a may be exposed to a descum etch. An etching process (for example VUV descum) may remove the resist at recessed areas 166 to expose first TCO layer 160a. The exposed area of TCO layer 160a may transfer the charges out. Resist etching may be performed with a low cost method, such as VUV desum, which is compatible with roll-to-roll processing.

A second TCO layer 160b and/or a metal layer (e.g., 10 nm titanium) may be positioned on patterned layer 146a. Second TCO layer 160b may aid in conducting charges generated, for example, at the active layer 162 located at apex 168 and/or sidewalls 147. TCO layer 160b may be configured to be thin enough such as to not occupy much space and not substantially absorb incoming light, while providing fairly good conductivity. Active layer 162 may then be deposited on TCO layer 160b. It should be noted that optional choices of nanostructured solar cell 100 (shown in FIG. 3) may be incorporated into the design of nanostructured solar cell 100a.

Figure 5:
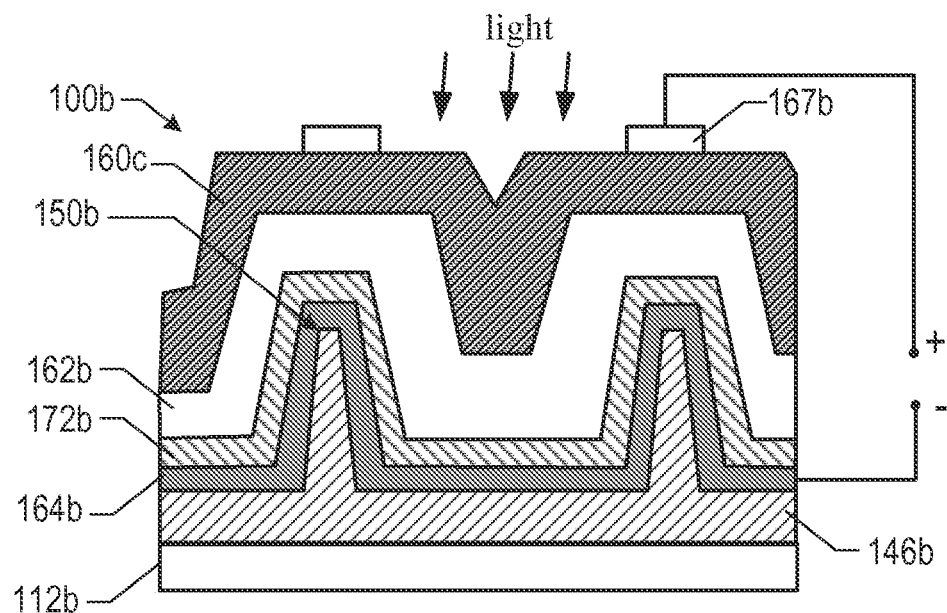

FIG. 5 provides a variation of nanostructured solar cell 100 shown in FIG. 3, illustrated as nanostructured solar cell 100b.

It should be noted that optional choices of nanostructured solar cell 100 shown in FIG. 3 may be incorporated into the design of nanostructured solar cell 100b.

Nanostructured solar cell 100b is generally a reverse design of nanostructured solar cell 100, with patterned layer 146b having nanostructures 150b formed on substrate 112b. Substrate 112b of solar cell 100b, however, need not be transparent as it is not on the path of sunlight. Conducting layer 164b is formed over patterned layer 146b, followed by buffer layer 172b, active layer 162b and TCO layer 160c. Metal contact 167b can be formed on TCO layer 160c.

Figure 6:
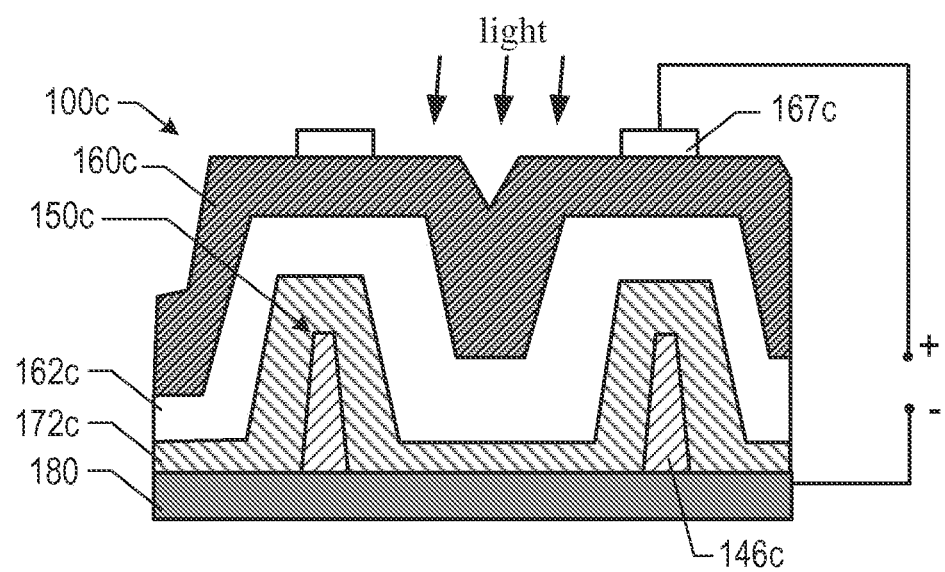

FIG. 6 provides a variation of nanostructured solar cell 100a shown in FIG. 4, illustrated as nanostructured solar cell 100c. It should be noted that variations of nanostructured solar cell 100a shown in FIG. 4 may be incorporated into the design of nanostructured solar cell 100c.

Nanostructured solar cell 100c is generally a reverse design of nanostructured solar cell 100a. Generally, solar cell 100c may include a conductive layer 180 with patterned layer 146c formed thereon. The residual layer of patterned layer 146c may be etched away as described herein, leaving nanostructures 150c. Buffer layer 172c, active layer 162c and TCO layer 160c are formed over nanostructures 150c, and metal contact 167c can be formed on TCO layer 160c. Conductive layer 180 may be formed of materials including, but not limited to stainless silver or aluminum and/or a metal coated glass or plastic polymer (e.g., PET, PEN, or inorganic materials such as clay and ceramic) or other conductive materials.

Figure 7:
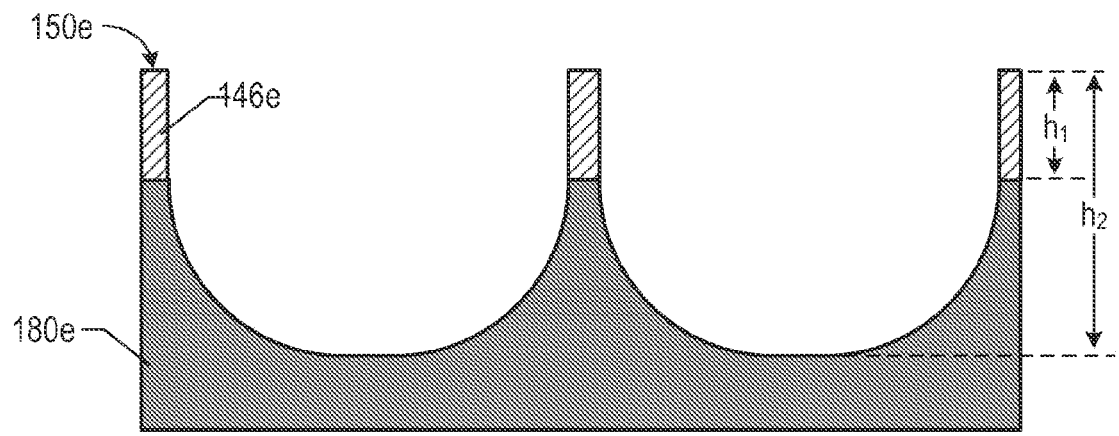
FIG. 7 illustrates a simplified side view of a patterned layer wet-etched to increase relative height of nanostructures.

FIG. 7 illustrates a variation of solar cell 100a and 100c wherein wet etching of conductive layer 180e may increase relative height of nanostructures 150 from $h_1$ to $h_2$. Wet etching may be through the use of an acidic solution, generating a concave shape within conductive layer 180e. Wet etching is generally isotropic and may have significant undercutting, enlarging opening areas in conductive layer 180e. This undercutting, however, may be estimated and incorporated within line width.

Wet etching may be used to increase the feature height and aspect ratio of the nanostructures. It is also advantageous due to its low cost and compatibility with roll-to-roll processes. However, etching into conductive layer 180 or other non-conductive substrates need not be limited to wet etching; other etching methods such as dry etching may be used if applicable.

As described above in relation to FIGS. 1 and 2, imprint lithography generally consists of replicating a topographic pattern from template 118 into formable material 134 located between template 118 and substrate 112. During imprinting, distance between template 118 and substrate 112 may be reduced, allowing formable material 134 to flow, conforming it to the topography of template 118 and substrate 112. When template 118 and substrate 112 are very close together, the flow channel for formable material 134 is narrow and, as such, flow is restricted. This condition may be improved if formable material 134 is formed of low viscosity materials (e.g., materials with viscosity less than 10 centipoise). Low-viscosity materials provide for a flow channel between approximately 25 nm or smaller. The thickness of the flow channel generally provides the thickness of residual layer 148. As a consequence of deformation flow, a residual layer 148 having a non-zero thickness is always present after imprinting into formable material 134. The most common method for removing residual layer 148 is to perform a plasma-based etching process. Such processes are capable of directional (i.e., primarily vertical) etching such that residual layer 148 may be removed with minimal change to lateral dimensions of nanostructures 150. Plasma-based etching, however, may not be suitable for formation of solar cells 100-100d provided herein due to factors such as high cost, low throughput, and/or a reduced pressure environment.

As an alternative, a vacuum ultraviolet (VUV) process may be used to remove residual layer 148 and/or underlying organic layer formed by non-imprint methods within solar cells described herein. Generally, VUV process exposes material to radiation from a light source within a gaseous environment of a controlled composition. Radiation of VUV may be between approximately 120 nm to 190 nm wavelength. Radiation may be produced using an Xe excimer dielectric barrier discharge lamp having a peak intensity at a wavelength of approximately 172 nm with a spectral bandwidth of approximately 15 nm FWHM. In one example, intensity of radiation at the material surface may be approximately 5 to 150 nW/cm$^2$. Gas composition may include at least 95 percent nitrogen and less than 5 percent oxygen. VUV process may also be used in removing underlying organic layers from patterns formed by non-imprint methods.

VUV process may also be used to etch inorganic materials. In etching inorganic materials, gas compositions may be altered from those used for organic materials. For example, chlorine-containing gas mixtures may etch materials such as copper and gallium arsenide. See Li et al, Appl. Phys. A, vol. 57 p 457, 1993 and Streller et al. Appl. Surf. Sci. vol. 109/110, p 442, 1997, which are hereby incorporated by reference in their entirety. Silicon layers may be etched in gas mixtures containing fluorinated compounds such as $XeF_2$. See Streller et al, Appl. Phys. Lett, vol. 69 p 3004, 1996, which is hereby incorporated by reference in its entirety. In some embodiments, VUV process may be followed by a liquid processing step further improving etching performance. For example, SiC can be etched by first exposing to VUV radiation, then immersing in an aqueous solution containing HCl and H2O2, and then immersing in an aqueous solution containing HF. See Zhang et al, Appl. Phys. A. vol 64, p 367, 1997, which is hereby incorporated by reference. In this example, the aqueous solutions assist in the removal of VUV exposure products. U.S. application Ser. No. 13/014,508 filed Jan. 26, 2011, incorporated herein in its entirety, illustrates an exemplary system and methods for VUV processing.

Throughput of VUV process may be determined by a number of factors, including intensity of substrate surface, removal rate of material, thickness of material, and the like. As such, it may be desirable to minimize the thickness of the material to be removed, as this may increase throughput of the VUV process. For an imprint lithography process, this may require imprinting with a very thin residual layer. Imprinting with a very thin residual layer, however, is generally not straightforward for all pattern types. For example, as the residual layer becomes very thin, the flow through the channel is increasingly restricted as described earlier. This restriction of flow may be minimized by minimizing the fraction of the pattern that is at the residual layer level.

Figure 8A:
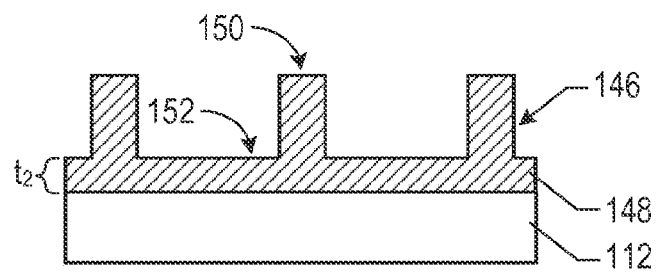
FIGS. 8A-B illustrate simplified side views of a patterned layer for a solar cell.
Figure 8B:
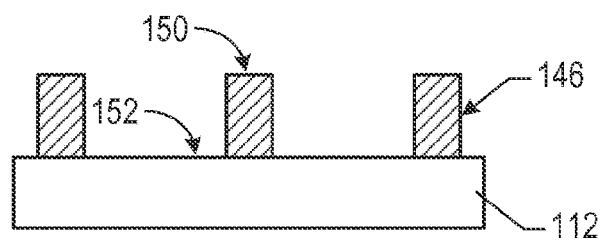

In one example, as illustrated in FIG. 8A, the pattern of nanostructures 146 may be designed in a sparse array, i.e., where the width of nanostructures 150 is substantially less than the distance 152 between nanostructures, and in some cases 2 to 3 times less than the distance. In such a pattern, thickness $t_2$ of residual layer 148 may be substantially large. To remove residual layer 148, patterned layer 146 may be exposed to VUV process eliminating residual layer 148 as shown in FIG. 8B. However, it may take a long time as $t_2$ is thick and the throughput may not be high.

Figure 9A:
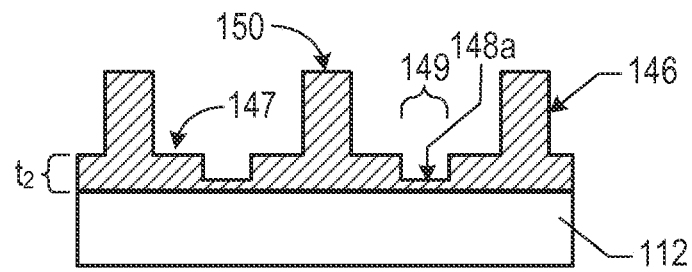
FIGS. 9A-B illustrate simplified side views of an exemplary nanostructure pattern for a solar cell.
Figure 9B:
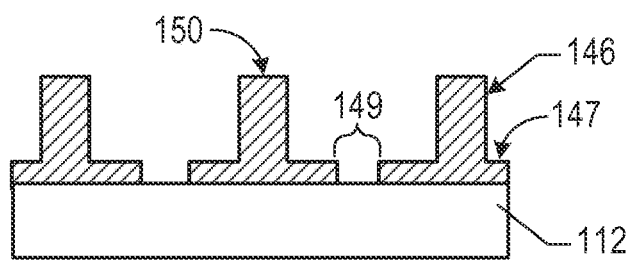
Figure 9C:
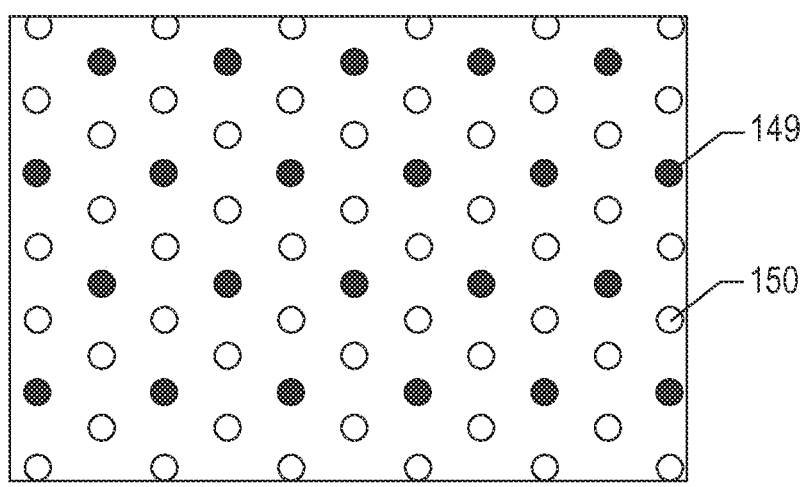
FIG. 9C illustrates a simplified top-down view of an exemplary nanostructure pattern for a solar cell.

Referring to FIGS. 9A and 9B, an improvement to the process may include forming patterned layer 146 with additional stepped patterns 147 adjacent to nanostructures 150 defining an even thinner residual layer 148a covering a small area 149 of patterned layer 148a. Contact to underlying substrate 112 may be achieved by removing only residual layer 148a at area 149 of patterned layer 146, as illustrated in FIG. 9A-B, rather than the entire thickness $t_2$ of the residual layer. The throughput of the VUV process is improved by reducing the thickness of the material that is removed. In addition, VUV exposure time is reduced minimizing deleterious effects of VUV exposure on nanostructures 150. For example, referring to FIG. 9C, nanostructures 150 may formed as pillars, as indicated by light circles, supplemented by contact holes 149, as indicated by dark circles. In this design, a real density of contact holes 149 may be sufficient to reduce contact resist, yet provide a very thin residual layer 148a to be easily removed by VUV process.

Figure 10A:
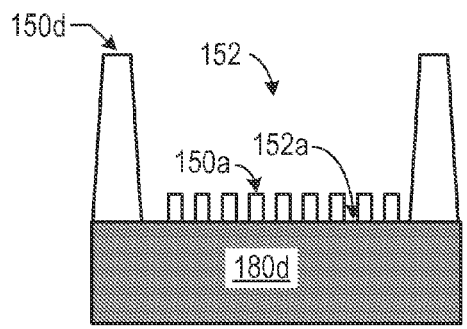
FIGS. 10A-10C illustrate an exemplary method of formation for texture features in a conducting layer.
Figure 10B:
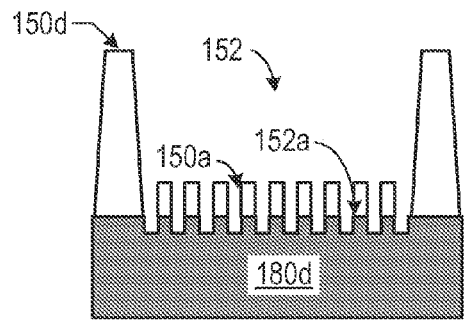
Figure 10C:
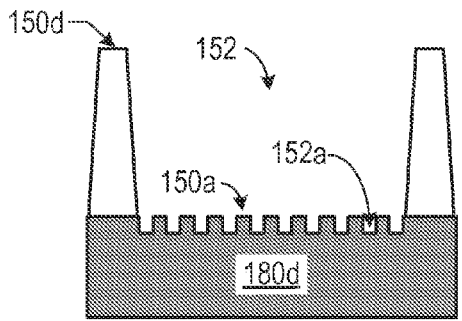

Referring to FIGS. 10A-C, the TCO layer and/or conductive layer of solar cells described herein may optionally be patterned using methods and systems related to FIGS. 1 and 2. FIGS. 10A-C illustrate conductive layer 180d having a textured surface with texture features 150a and 152a that may reduce light reflection. Further, a well defined pattern on conductive layer 180 may increase light scattering and enhance the Plasmonic effect, increasing light trapping. Dimensions of optimized texture features 150a and 152a (e.g., shape, depth, aspect ratio) may vary in relation to dimensions of nanostructures 150 and 152 provided in relation to FIGS. 3-6 (e.g., may not be sparse and/or aspect ratio may be much lower, for example approximately 1:1 or even lower).

Patterning of conductive layer 180 may excite the Surface Plasmonic (SP) effect at the metal/semiconductor (e.g., metal/Si, metal/ITO, metal/ZnO, or the like) interface and efficiently trap/guide light to an active layer. To that end, a thinner active layer 162 may be sufficient in photo absorption and/or light trapping, wherein such "thinner" film may include electrical characteristic such as better charge collection, less recombination with shorter exciton migration, and the like. Additionally, a thinner film may reduce the dark current, increase open-circuit voltage, and/or the like.

The SP effect generally applies to interfaces, but may affect up to a few hundred nanometers through exponential decay. Optical field intensity enhancement may be up to 100 times for a resonance wavelength at metal dielectric interface (e.g., $Ag/SiO_2$) with designed geometry. The resonance wavelength can be tuned by changing the pitch size and metal/dielectric materials. Incident solar flux may be effectively turned by up to 90°, and light may be absorbed along the lateral direction of the solar cell having dimensions that are orders of magnitude larger than the vertical length (active layer thickness). For example, in a simulation, nanopatterned features 150a with a pitch of about 180 nm indicated a maximal enhancement of 98.8 times achieved at resonance wavelength of 800 nm with Ag as back reflective layer and ITO patterns and a-Si layer. Although the enhancing factor decays quickly as the wavelength shifts from the peak value (e.g., 800 nm), the overall enhancement of the visible and near IR light region (from 400 to 1000 nm) is very significant, with 66 times at 900 nm, 15 times at 1000 nm, and 22 times at 700 nm, 6 times at 500 nm. For a TCO layer, the scale of nanopatterned features 150a may be configured based on the structure of solar cell, the optical properties and thickness of the active layer, and/or the required resonance wavelength of light (e.g., a tandem solar cell having a different bandgap to absorb and convert different portions of sunlight).

Solar cells 100-100c shown in FIGS. 3-6 may include further textured features 150a and 152a of TCO layer 160 and/or conductive layer 180 to further increase PCE. This may include one or more additional steps to formation of solar cells 100-100c by adding patterning TCO layer 160, back reflective layer 164, or both.

FIGS. 10A-10C illustrate one embodiment wherein formation of sparse patterns for deposition of active layer 162 and further patterning of conductive layer 180d may be done in a single lithography step. For example, design of template 118 (shown in FIG. 1) may provide for imprinting of functional material 134 with texture features 150a and 152a and nanostructures 150d as shown in FIG. 10A. Residue layer of nanostructures 150d and texture features 150a and 152b may be removed by VUV or other processes. Wet etching or other proper etching methods to is performed to etch the exposed conductive layer 180d through trenches 152a, as shown in FIG. 10B. A second descum etching processes may remove formable material (i.e., resist) for continued deposition as shown in FIG. 10C. Thus, additional PCE may be gained with minimal cost.

Figure 11:
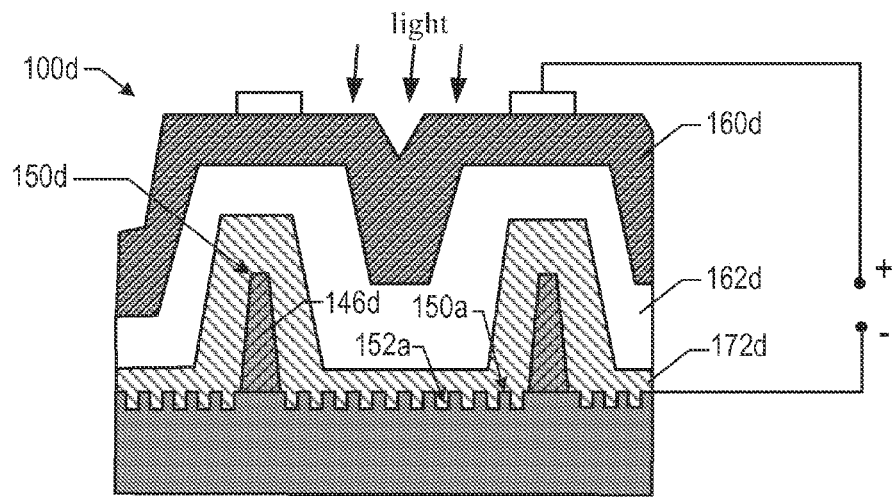
FIG. 11 illustrates a simplified side view of an exemplary embodiment of a nanostructured solar cell having texture features in a conducting layer.

FIG. 11 illustrates an exemplary embodiment of nanostructured solar cell 100d similar in design to solar cell 100c (shown in FIG. 6) with the addition of a patterned conductive layer 180d. In addition to nanostructures 150d, nanopatterned conductive layer 180d includes regions of texture features 150a and 152a that may aid in trapping more light due to the SP effect and surface scattering, leading to an even higher PCE than solar cell 100c.

Figure 26:
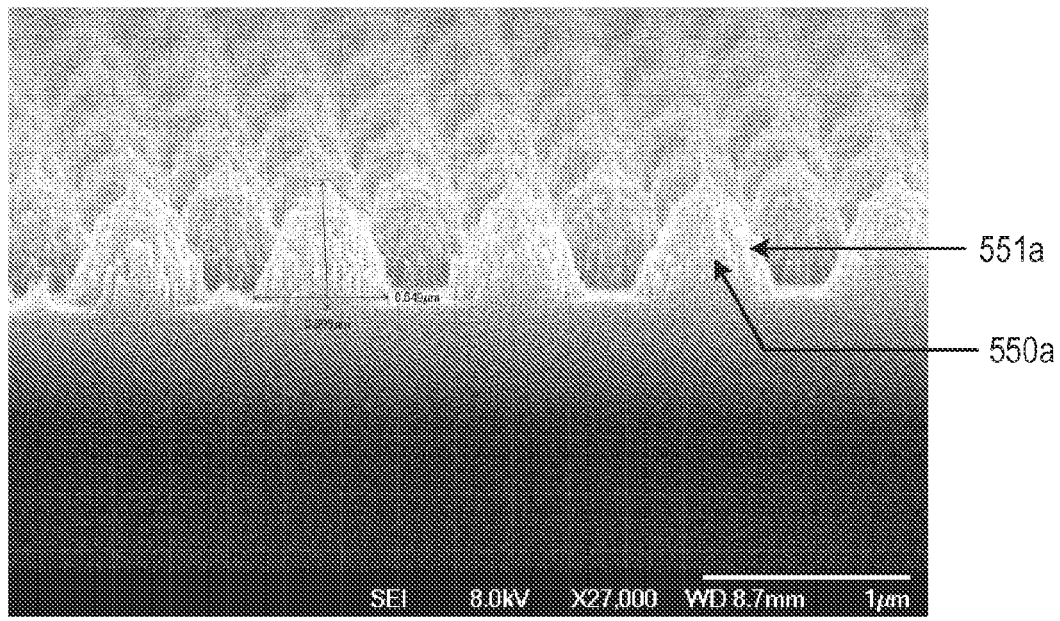
FIGS. 26-27 show scanning electron micrographs of nanopatterned thin film layers having nanostructures with roughened surfaces.

Further texturing of nanostructures can also be performed to increase PCE. For example, the surfaces of formed nanostructures can be processed to possess additional roughness. This rough surface provides additional light scattering and trapping, and therefore further improves PCE. The roughness texture can be randomized and the feature size can be substantially less than the primary pattern feature size. The rough texture can be incorporated into the imprinting template in such way that the roughness can be transferred to imprinted resist directly from the template. Alternatively, the roughness can be created by dry etching. During dry etching, under certain conditions, polymer or other materials can be deposited on the samples and form a micro-mask. This micromasking effect can induce etched surface roughness. FIG. 26 shows a dry etched glass with rough surface 551a on the regular patterned (larger) pyramid nanostructure 550a.

Figure 27:
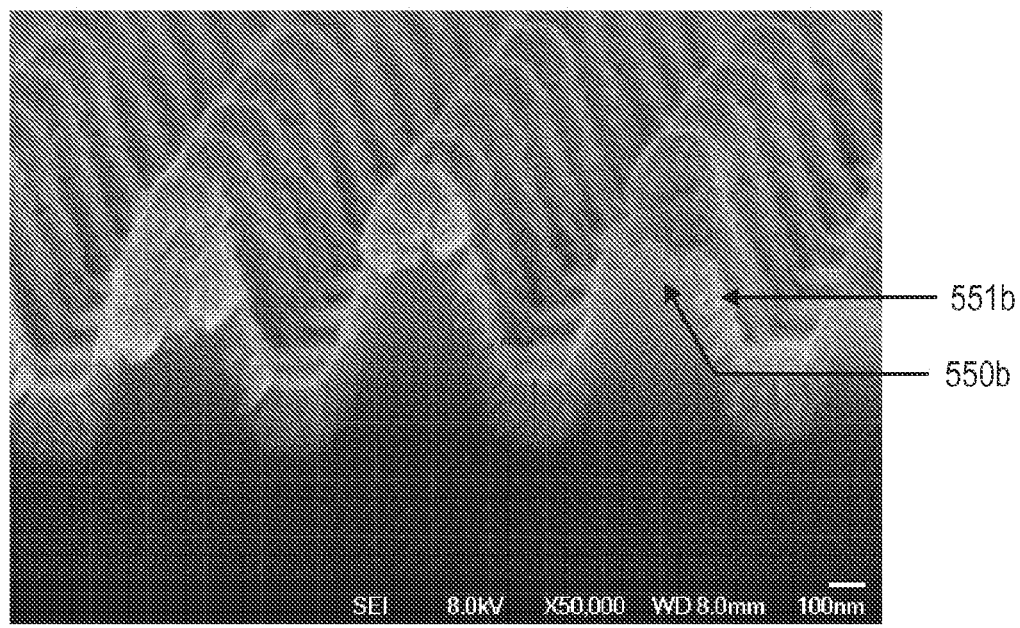

The roughness can also be created by thin film deposition on the template or directly on the solar cell patterned surface. Under curtained conditions, the deposited thin film can be granular; therefore create roughness. FIG. 27 is a SEM image showing rough ITO thin film deposited on patterned glass substrate having pyramid nanostructures 550b, creating rough surface 551b.

Figure 12:
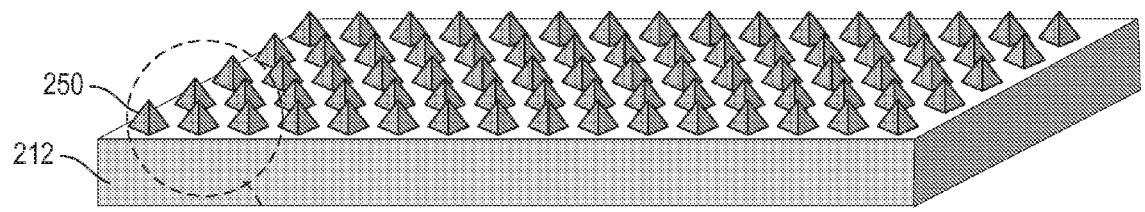
FIG. 12 illustrates a simplified perspective view of another exemplary embodiment of a nanopatterned substrate for a thin film solar cell formed in accordance with the present invention.
Figure 13:
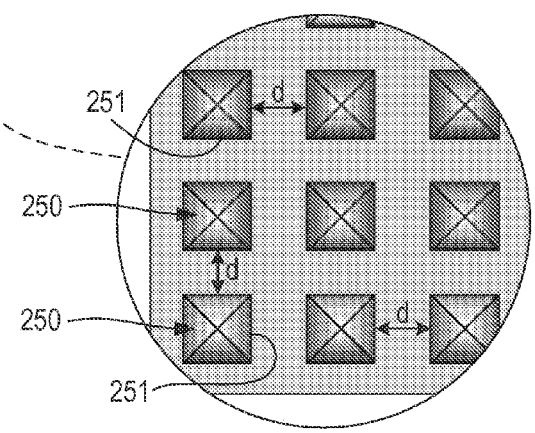
FIG. 13 illustrates a top-down view of a section of the nanopatterned substrate of FIG. 12.
Figure 14A:
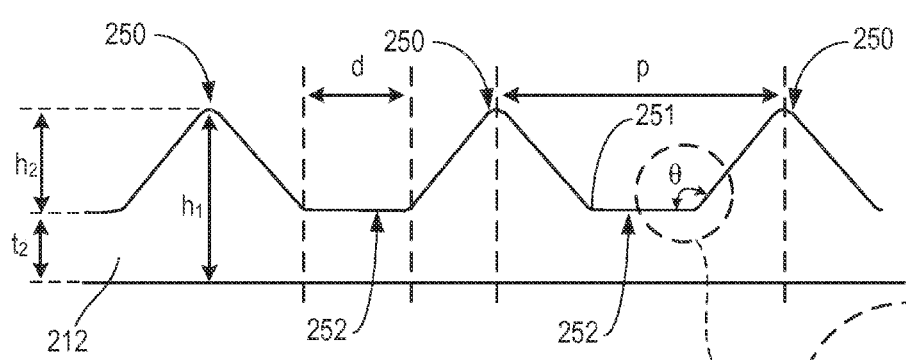
FIG. 14A illustrates a simplified side view of a section of the nanopatterned substrate of FIG. 12.

FIGS. 12, 13 and 14A-14B illustrate additional exemplary embodiments of nanostructures for use in solar cells; in particular, pyramid nanostructures 250, which have particularly been shown to have improved light trapping characteristics. Referring to FIGS. 12, 13 and 14A, pyramid nanostructures 250 have height h and are arrayed in columns and rows at pitch p with at distance d between bases of adjacent pyramids. Height h may generally be at least approximately 100 nm, or at least 500 nm, or at least 1 µm. In certain aspects, height h may generally be in the range of 150 to 1000 nm. Pitch p may generally be at least approximately 200 nm, or at least approximately 1 µm, or at least 2 µm. In certain aspects, the pitch p may generally be in the range of 300 nm to 600 nm. Pyramid nanostructures 250 have square bases, as shown, but the bases can likewise be other polygons or round shapes. The angle θ between surface 152 and face 154 of pyramid nanostructures 250 may generally be at least 100 degrees, or at least 135 degrees, or at least 150 degrees, or at least 170 degrees. In certain aspects, angle θ may be in the range of 110 to 150 degrees. In addition, the overall feature size of pyramid nanostructures 250 may be pre-biased based on a predicted decrease in size during etching and/or to accommodate additional layering and/or imprinting processes.

Figure 14B:
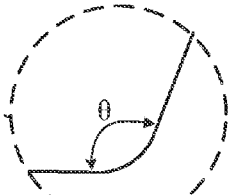
FIG. 14B illustrates an expanded simplified side view of a section of the nanopatterned substrate of FIG. 14A.

As further illustrated in FIGS. 14A-14B, the intersection between surface 252 and the bases of pyramid nanostructures 250 may be rounded. Such rounding can be accomplished in a variety of ways, including etching and/or imprinting techniques as further described herein. This rounding aspect can be important in the stability and improved performance of the additional materials that are layered onto the substrate to make up the solar cell. In particular, conducting material layered on patterned substrate having sharp angles is susceptible to strain and cracking, thus damaging the conductive material and reducing cell performance. By rounding the intersection of the surface 252 with the bases of pyramid nanostructures 250, conducting material can be deposited on the patterned substrate and retain its integrity across the pattern, leading to improved performance.

Figure 15:
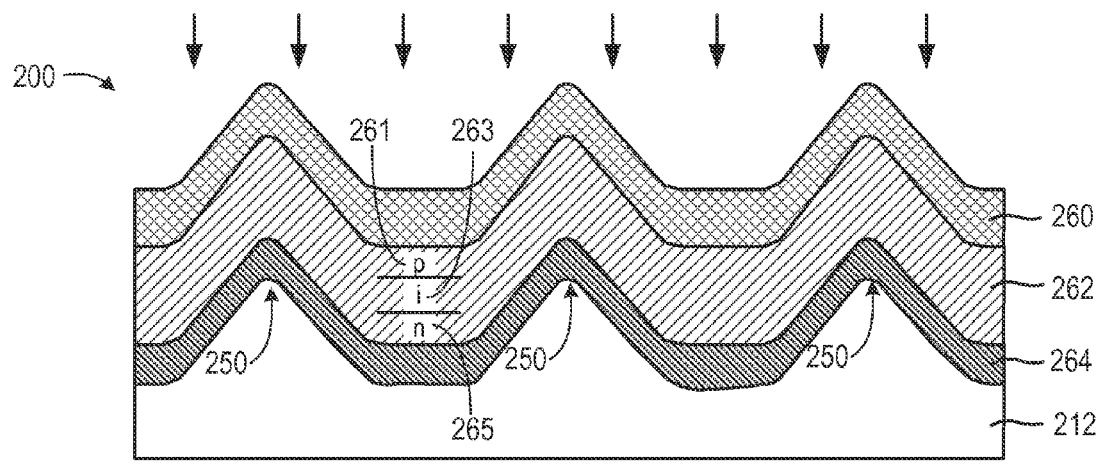
FIG. 15 illustrates a simplified side view of an exemplary embodiment of a nanopatterned thin film solar cell formed in accordance with the present invention.

Referring to FIG. 15, solar cell 200 can be formed subsequent to formation of pyramid nanostructures 250 on substrate 212 as previously described. First conducting material 264 may be deposited over substrate 212. First conducting material 264 may be formed of materials including, but not limited to, aluminum, silver, and/or the like. Generally, qualifying materials for conducting material 264 include materials having high reflectivity and conduction. The conducting material can be applied directly to substrate 212, or optionally an adhesion layer (not shown) can be applied between substrate 212 and conducting material 264 to promote adhesion between substrate 212 and conducting material 264. Materials suitable for the adhesion layer include but are not limited to nickel and Cr. The adhesion layer and conducting material 264 may be deposited using techniques including evaporation, sputtering, CVD and the like.

The thickness of conducting material 264 may be configured to provide good conductivity; e.g., within a range from 30 nm to 200 nm or more. Additionally, the thickness of conducting material 264 may be designed to provide protection of solar cell 200 against environmental degradation. Conducting material may reflect light to active layer 262. Additionally, conducting material 264 may trap light having a distinct wavelength range through plasmonic effects corresponding to size and/or shape of its surface textures.

A semiconductor layer 262 may be deposited on conducting material 264. Semiconductor layer 262 may be a three-layer (p-i-n) of a-Si: a-Si p-layer 261, a-Si intrinsic layer 263, a-Si n-layer 265, with the p-layer typically oriented proximate to the light source. Semiconductor layer 262 may be deposited by PECVD, LPCVD, HWCVD, or the like. Generally, semiconductor layer 262 may be deposited at a temperature of approximately 200° C. or a temperature lower than the degradation temperature of underlaying patterned materials. Other suitable semiconductor materials useful in thin film solar cells may also be used, including but not limited to microcrystalline silicon, nanocrystalline silicon, cadmium telluride, and copper indium gallium selenide.

A buffer layer (e.g., zinc oxide) (not shown) may optionally be positioned between first conducting material 264 and semiconductor layer 262. The thickness of a buffer layer may be configured to be thin enough for Plasmonic effects of contacting metal and induced stress involving the film, yet thick enough to sufficiently block the holes (e.g., between approximately 30 nm-500 nm). The buffer layer may aid in the collection of electrons, and prevent atom diffusions between material 264 and layer 262. Other grading or buffer layers can be added into the p-i-n junction to improve the performance. Examples include a-SiC window layer and μc-Si (or nc-Si) doped layer.

A second conducting material 260 may be positioned on semiconductor layer 262. When second conducting material 260 is proximal to the light source, second conducting material 260 may be a transparent conducting oxide layer (TCO layer). Second conducting material 260 can be deposited by evaporation, CVD, sputtering, or the like.

Second conducting material 260 may be formed of materials including, but not limited to, indium tin oxide, zinc oxide, tin dioxide, and/or the like. Flexible conductive layers and/or incorporated materials may be useful for thin film solar cells, including grapheme-based conductive layers and or fine metal grids. Generally, qualifying materials conducting material 260 includes materials having a high conductivity, balanced with transparency to sunlight. Second conducting material 260 generally includes low sheet resistivity, e.g., approximately 100 ohm/sq or less. Thickness of second conducting material 260 may be within the range of approximately 50 nm to 500 nm. Deposition of second conducting material 260 on semiconductor layer 262 forms an electrode.

Design of arrayed pyramid nanostructures 250 may be configured to provide a high aspect ratio, increasing absorbing capabilities of semiconductor layer 262 while maintaining deposition thickness. Aspect ratio may be from 0.5 to 10 or more. In one example, height of nanostructures 250 may be in the range of approximately 200 nm to 800 nm or more. In another example, pitch may be between approximately 500 nm to 1.5 μm or more, with nanostructures 250 having a width from 25 nm to 500 nm or larger.

Figure 16:
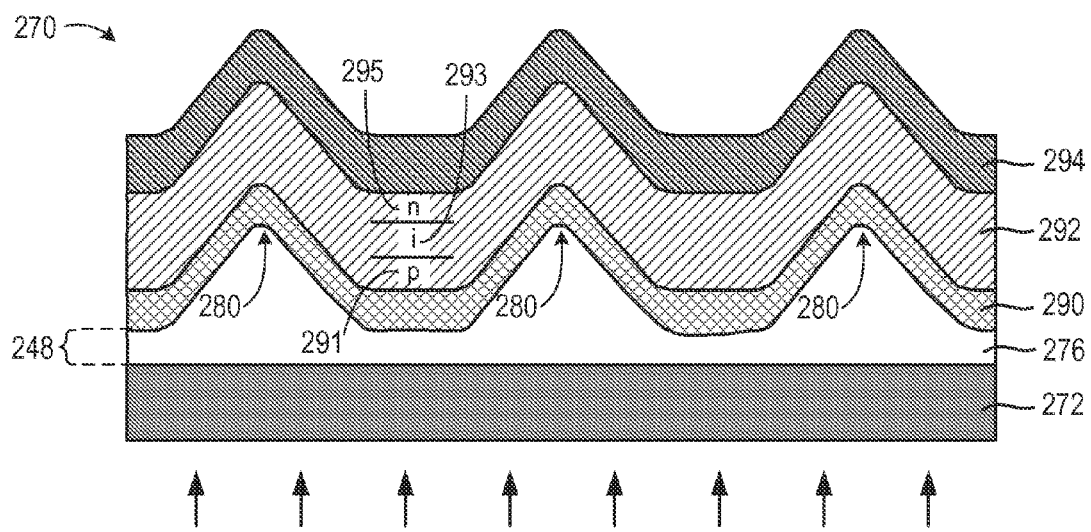
FIG. 16 illustrates a simplified side view of another exemplary embodiment of a nanopatterned thin film solar cell formed in accordance with the present invention.

FIG. 16 provides a variation of nanostructured solar cell 200 shown in FIG. 15, illustrated as nanostructured solar cell 270. Nanostructured solar cell 270 shown in FIG. 16 is generally a reverse design of nanostructured solar cell 200 shown in FIG. 15, designed to convert energy from a light source originating on the opposite side of the substrate. Substrate 272 has patterned layer 276 formed thereon, containing patterned pyramid nanostructures 280 and residual layer 248. Alternatively patterned layer 276 may itself be transferred into a substrate using typical etching or other pattern techniques. Patterned layer 276 can be formed by imprint lithography techniques as previously described using a polymerizable material (also referred to as an imprint resist) to yield a formed pattern having a thin residual layer between the pattern features. Residual layer 248 may have a thickness of less than 50 nm, or less than 25 nm. Minimizing residual layer thickness reduces overall material consumption, providing cost benefits in manufacturing as well as lowering light absorption, which increases conversion efficiency.

Substrate 272 may be formed of transparent materials, including glass and/or a transparent polymer. Patterned layer 276 may be a transparent polymer. In certain cases, it may be advantageous to use a silicon-containing polymer for the imprint resist. Once cured, the patterned layer can be subjected to oxygen gassing to form a glassy top surface layer. Such a top surface layer may itself be advantageous as an interface for further deposition of thin film solar cell components. It also adds strength and stability to the formed pattern, providing greater stability under deposition conditions and lower outgassing (either through pre-baking or oxidation). In addition, it provides a seal against moisture to protect against environmental degradation of the a-Si. Such glassification of the top surface layer can further be advantageous in creating working templates for imprinting additional patterns.

First conductive material 290 is deposited on patterned layer 276, and may be a transparent conducting oxide (TCO) layer. Semiconductor layer 292 is deposited over first conducting material and again may be a three-layer (p-i-n) of a-Si: a-Si p-layer 291, a-Si intrinsic layer 293, a-Si n-layer 295. In this case the p-layer may be formed proximal to patterned layer 276 and the intended orientation of the light source, with i-layer 293 and p-layer 295 formed subsequently. Second conducting material 294 is formed over the semiconductor layer 292, and may be formed of materials including, but not limited to stainless silver or aluminum and/or a metal coated glass or plastic polymer (e.g., PET, PEN, or inorganic materials such as clay and ceramic) or other conductive materials having reflective properties. A buffer layer (i.e. ZnO) can be deposited between 292 and 294 to improve performance.

Figure 24:
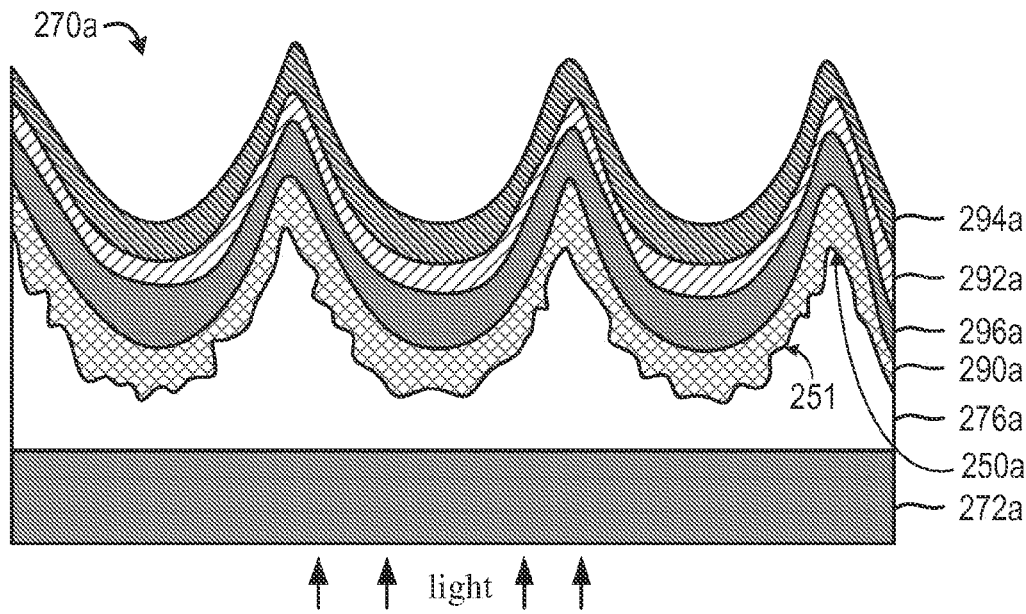
FIGS. 24-25 illustrate simplified side views of exemplary embodiments of nanopatterned thin film solar cell having nanostructures with roughened surfaces.
Figure 25:
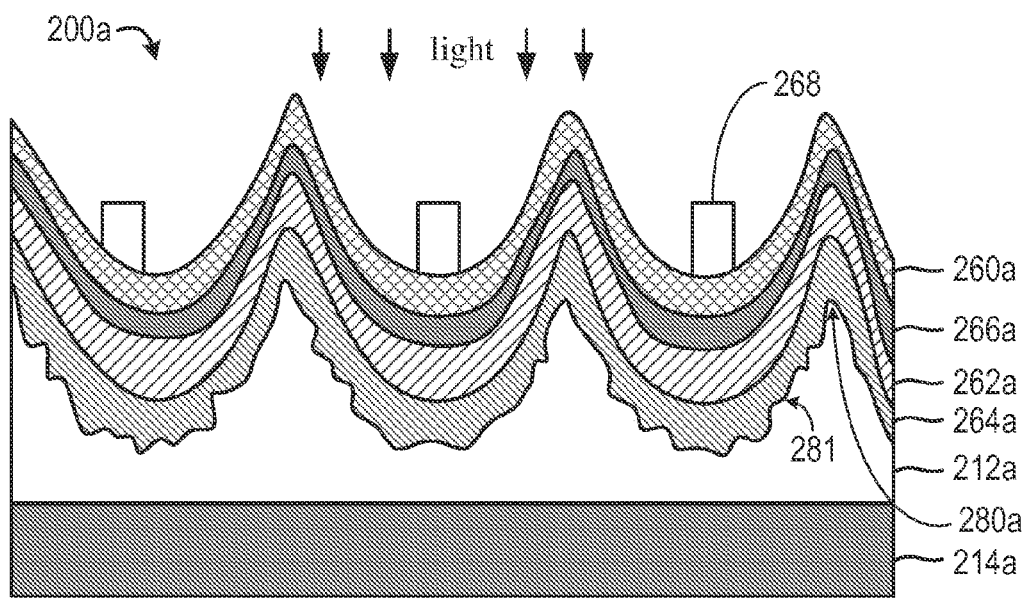

As previously described, the formed patterned layer and/or nanostructures can further be processed to add surface roughness to provide additional light scattering and trapping, and therefore further improve PCE. FIGS. 24-25 illustrate a-Si:H p-i-n solar cells with pyramid nanostructures having roughened surfaces. The basic configuration of solar cell 200a of FIG. 25 is similar to that of solar cell 200 of FIG. 15. In FIG. 25, imprint layer 212a is formed on substrate 214a, and is then subjected to a roughening process as described herein, providing roughened surface 281 to pyramid nanostructure 280a. Metal layer 264a, ZnO buffer layer 262a, a-Si:H layer (n-i-p layers from bottom) 266a and TCO top electrode layer 260a, are then layered over the substrate to form solar cell 200a. FIG. 24 illustrates solar cell 270a, similar to solar cell 270 of FIG. 14. Imprint layer 276a is formed on substrate 272a, and likewise subjected to a roughening process as described above, providing roughened surface 251 to pyramid nanostructure 250a. TCO layer 290a, a-Si:H layer (p-i-n layers from bottom) 296a, ZnO buffer layer 292a, and metal electrode 294a, are then layered over the substrate to form solar cell 270a.

Figure 17:
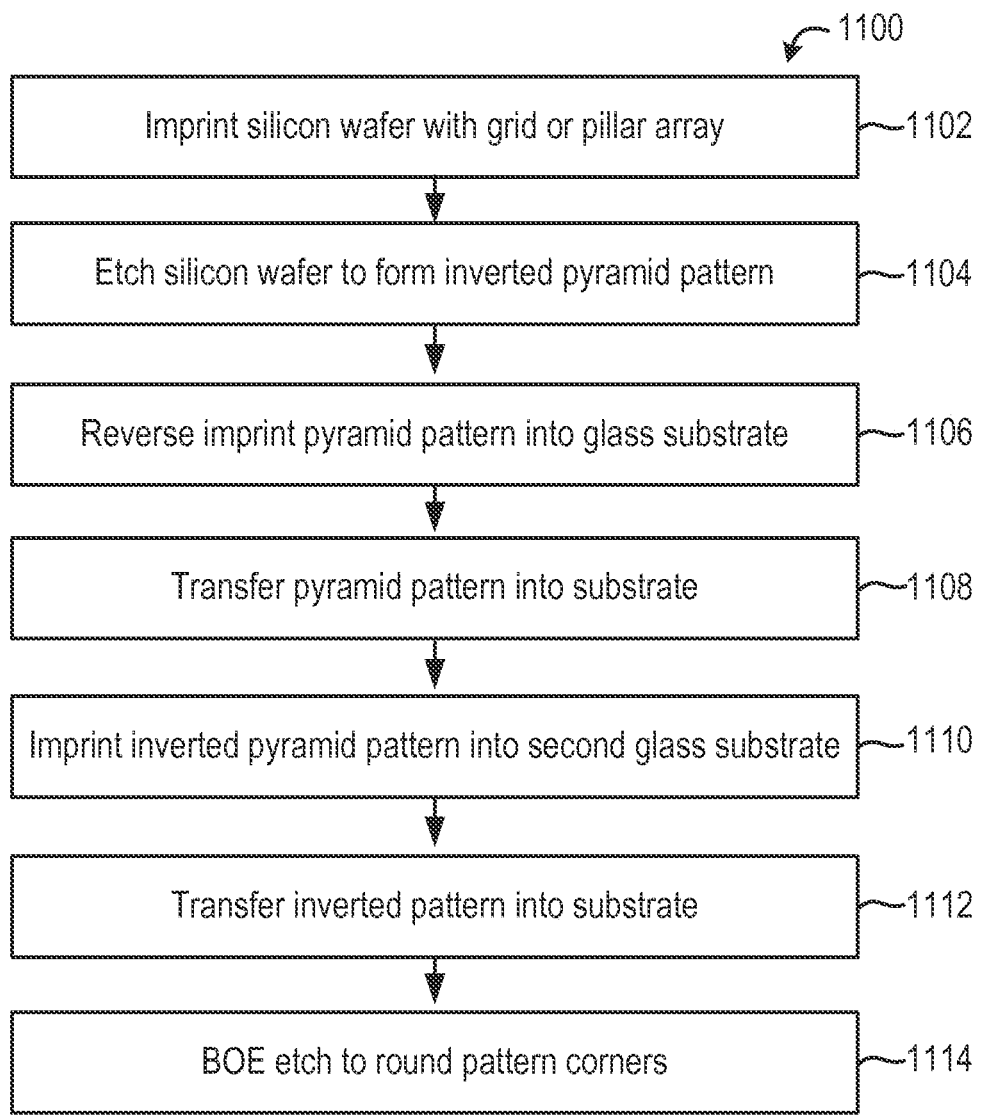
FIG. 17 illustrates a block diagram of an exemplary system for forming the nanopatterned thin film solar cell of FIG. 15.
Figure 18:
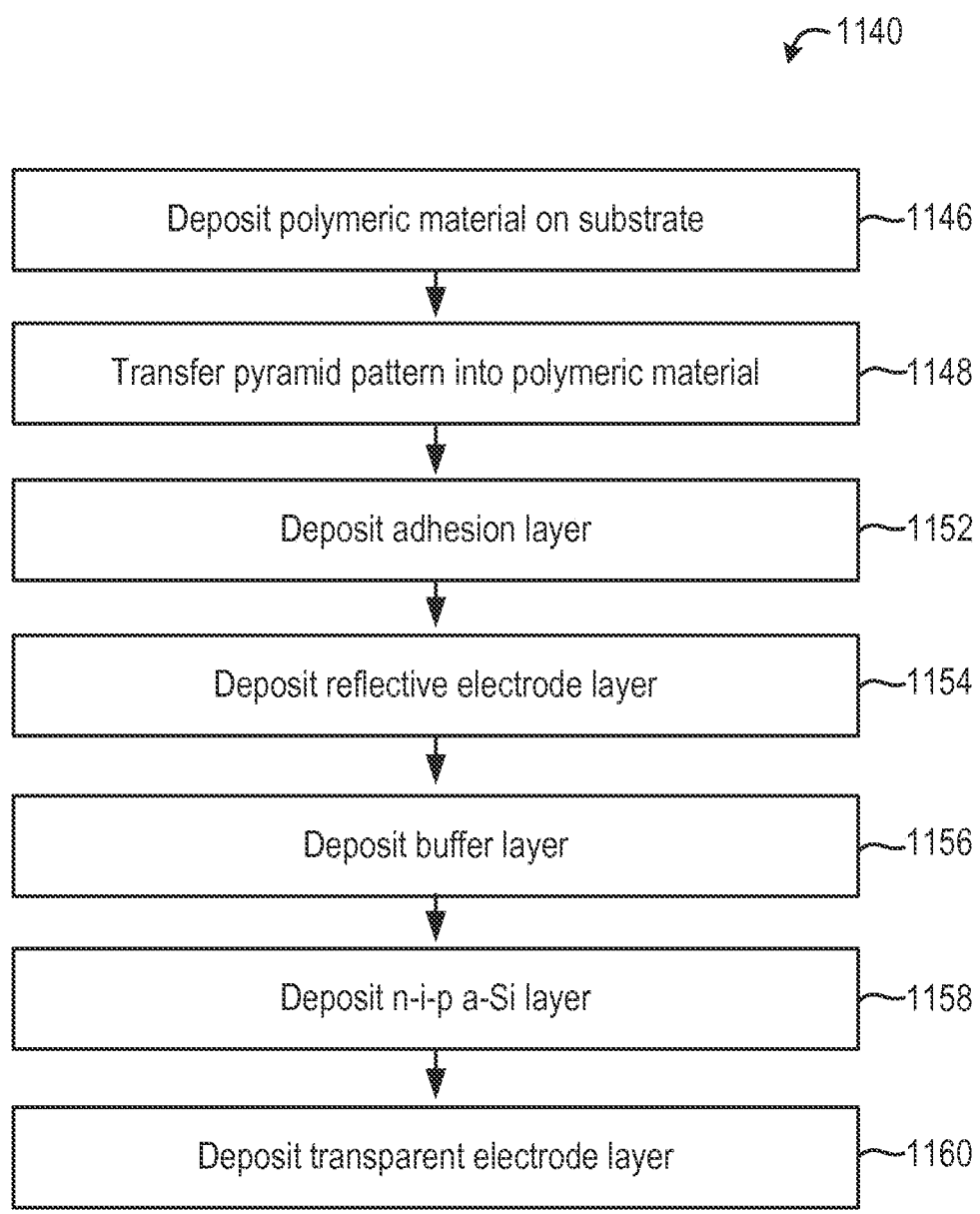
FIG. 18 illustrates a block diagram of an exemplary system for forming the nanopatterned thin film solar cell of FIG. 16.

A nanostructured solar cell having pyramid nanostructures can be fabricated by process 1100 illustrated in FIG. 17 and/or process 1140 illustrated in FIG. 18. FIG. 17 illustrates a process for forming an imprint template useful for imprinting an array of pyramid nanostructures into a desired substrate. In first step 1102, a nanoimprint patterning process is used to form a polymeric patterned layer consisting of a grid or a pillar array on the silicon wafer. The grid or pillar array is subjected to an anisotropic wet etch (e.g., KOH) to form an inverted array of pyramid nanostructures in the silicon (step 1104). In step 1106, the inverted array is then used to reverse imprint a patterned layer of pyramid nanostructures on a glass substrate, which is then RIE etched into the substrate in step 1108. These two steps are then repeated in steps 1110 and 1112, to reverse imprint the inverted array of pyramid nanostructures into a second glass substrate. In step 1114, the second glass substrate may be optionally subjected to a buffered oxide etch (BOE). The BOE etch rounds off the intersections between the substrate surface and the inverted pyramid nanostructures. The second glass substrate with the inverted array of pyramid is then useful as an imprint template for patterning functional resist material (i.e., a formable material) with the pyramid nanostructures onto a substrate of choice, including flexible substrates of glass, polymers, metals, and the like, that are of use in fabrication thin film solar cells. The imprinted material will have pyramid nanostructures with rounded intersections between the substrate surface and the pyramid bases.

An imprint template with a positive tone pyramid nanostructures for imprinting inverted pyramid nanostructures in a functional resist can be readily created simply by omitting steps 1110 and 1112.

The flowchart in FIG. 18 illustrates process 1140 for forming a solar cell according to FIG. 15, using a template produced according to the process of FIG. 17. In step 1146 a polymeric material, i.e., imprint resist, is deposited on a suitable substrate. For thin film solar cells, such suitable substrates include glass, flexible glass, plastic, and metal substrates. In step 1148, an imprint template as described above is used to transfer a pyramid nanostructure pattern into the material, the pattern being positive or reverse tone dependant on the tone of the imprint template. In step 1152, an adhesion layer of e.g., Ni, is formed over the patterned polymeric material by sputtering, followed in step 1154 by sputtering a reflective electrode material such as Ag onto the adhesion layer. In step 1156 a buffer layer of e.g. ZnO is sputtered over the electrode layer. In step 1158, PECVD deposition is used to form a layer of n-i-p a-Si. In step 1160, a second conductive material, such as a transparent conductive oxide (TCO) layer is sputtered onto the n-i-p a-Si layer.

It will be appreciated that solar cell 270 of FIG. 16 can be fabricated according to the above process 1140 simply by reversing the positioning of the first and second conductive layers and reversing the PECVD deposition process to form a layer of p-i-n a-Si.

Figure 19A:
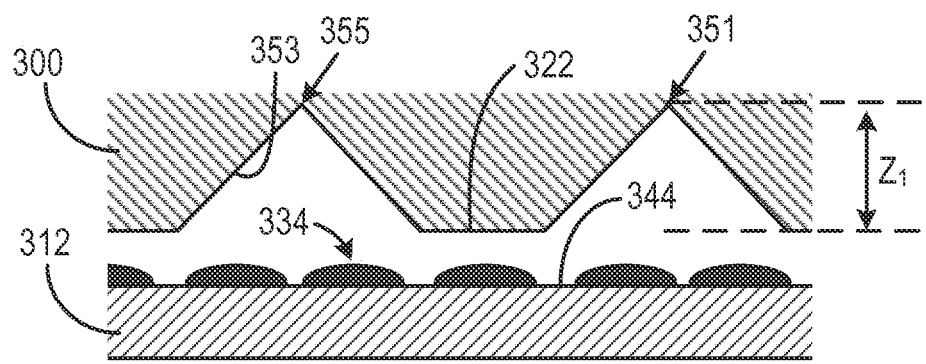
FIGS. 19A-19C illustrate an exemplary template used for forming a nanopatterned substrate for a thin film solar cell.
Figure 19B:
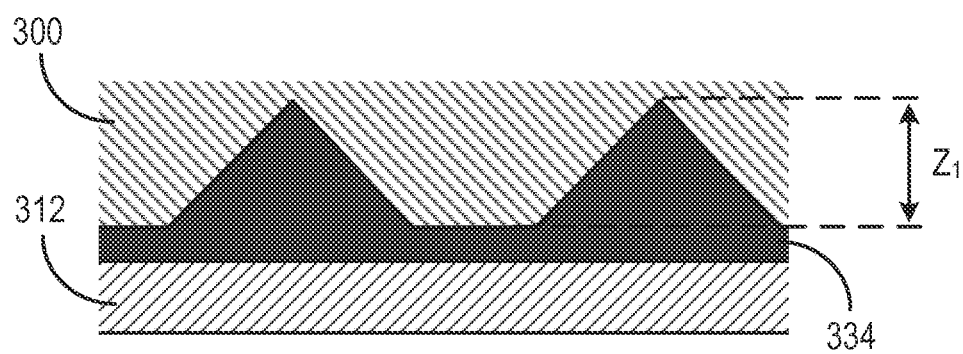
Figure 19C:
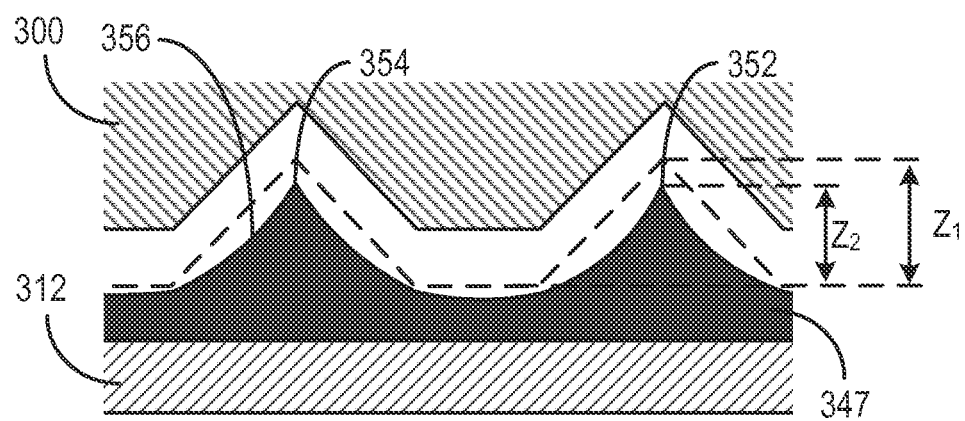

When using imprint lithography to create nanostructured solar cells with imprinted pyramid nanostructures, it may be desirable to design imprint templates that compensate for shrinkage that occurs as the polymer material is cured. FIGS. 19A-19C illustrate the impact of such shrinkage under typical conditions. Template 300 includes inverse pyramid nanostructure patterns 355 with faces 353 and a depth $z_1$ relative to template surface 312. Template 300 is positioned opposite substrate 312 and polymer material 334 is deposited as liquid on the substrate surface 344. As template 300 is moved toward substrate 312, template 300 contacts polymer material 334, which fills pyramid nanostructure patterns 355, and is then cured and released from the template (depicted in FIG. 19C) to yield nanostructured pyramids 354. Shrinkage is typically not uniform across all dimensions. As depicted in FIG. 19C, there is shrinkage in the vertical or z-axis direction from $z_1$ to $z_2$, typically on the order of 9- to 10%, but there is also non-uniform shrinkage across the face of pyramid 354, resulting in concave face 356.

Figure 20A:
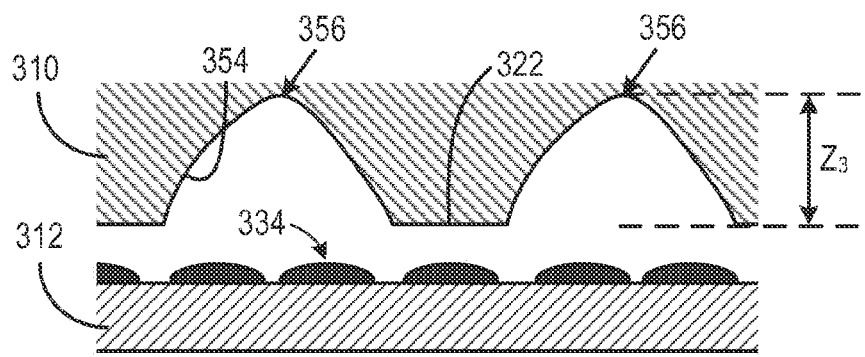
FIGS. 20A-20C illustrate another exemplary template used for forming a nanopatterned substrate for a thin film solar cell.
Figure 20B:
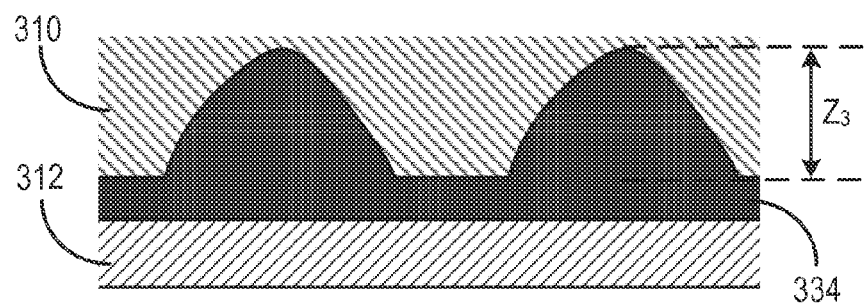
Figure 20C:
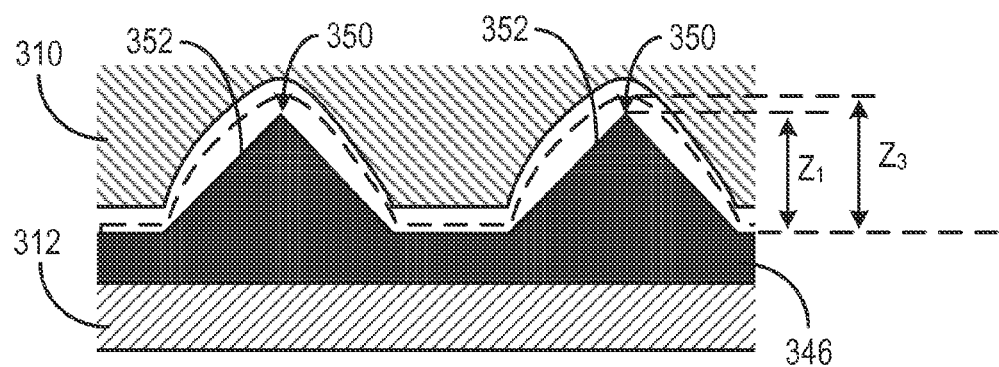
Figure 21A:
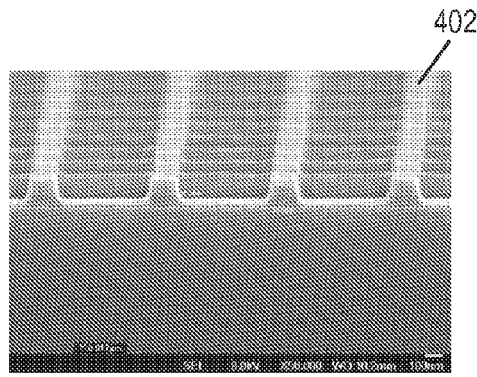
FIGS. 21A-D show scanning electron micrographs of a nanopatterned substrate useful in forming the nanopatterned thin film solar cell illustrated in FIG. 6.
Figure 21B:
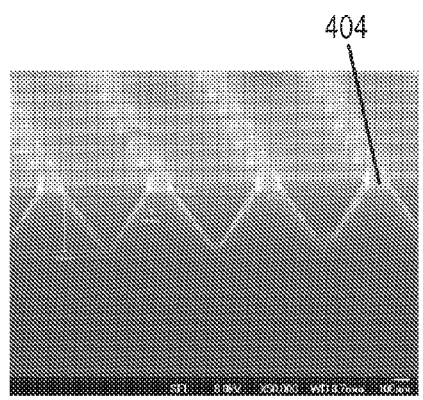
Figure 21C:
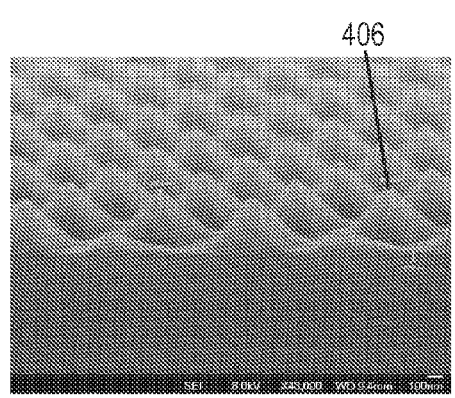
Figure 21D:
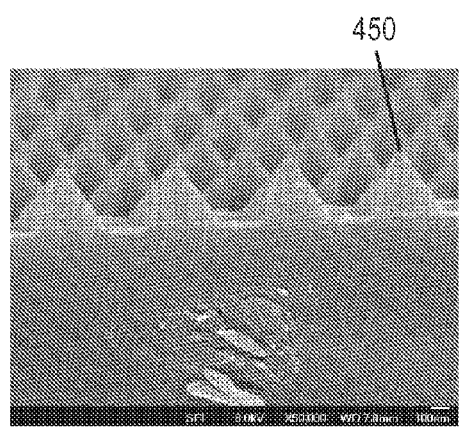

To achieve a desired pyramid nanostructure having a desired height $z_1$ and faces that are relatively flat, it may be necessary to create an imprint template having inverted pyramid nanostructures of a correspondingly greater depth $z_3$ and having faces or sidewalls that correspond to the pyramid faces that are concave, as is depicted in FIGS. 20A-20C. Template 310 as depicted in FIG. 20A is designed with inverse pyramid nanostructure patterns 356 with depth $z_3$ and with concave faces 354, and a depth $z_3$ relative to template surface 322. Upon filing, uncured polymer material 334 initially has corresponding dimensions, as depicted in FIG. 20B. Once cured the resultant pyramid nanostructures have the desired shape, as shown in FIG. 20C, with shrinkage in the z-axis reducing the height from $z_3$ to $z_1$ and the initially convex pyramid faces shrinking to relatively flat faces 352.

Examples

Figure 22:
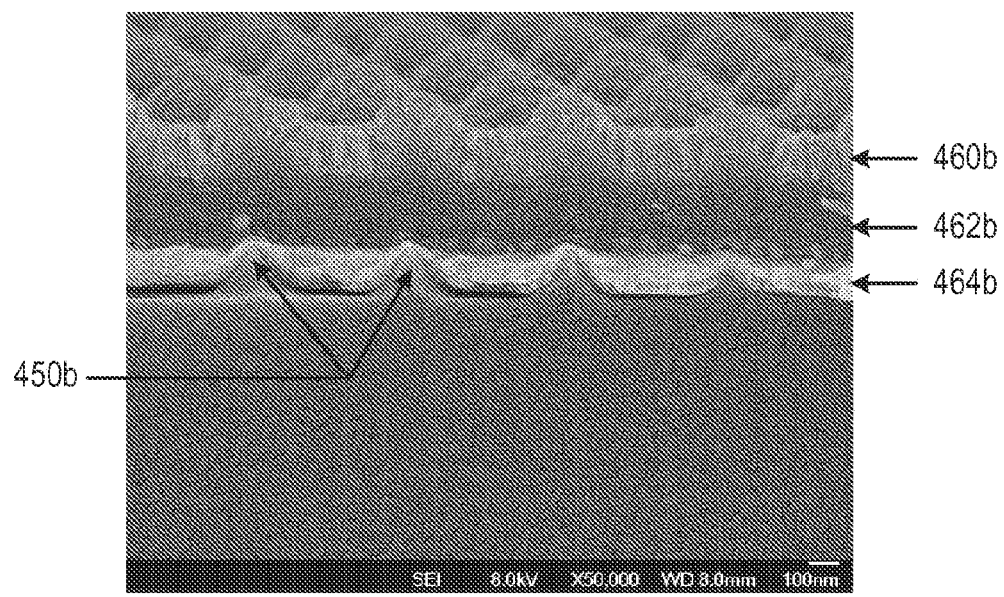
FIG. 22 shows a scanning electron micrograph of a nanopatterned thin film solar cell similar to the solar cell illustrated in FIG. 6.
Figure 23:
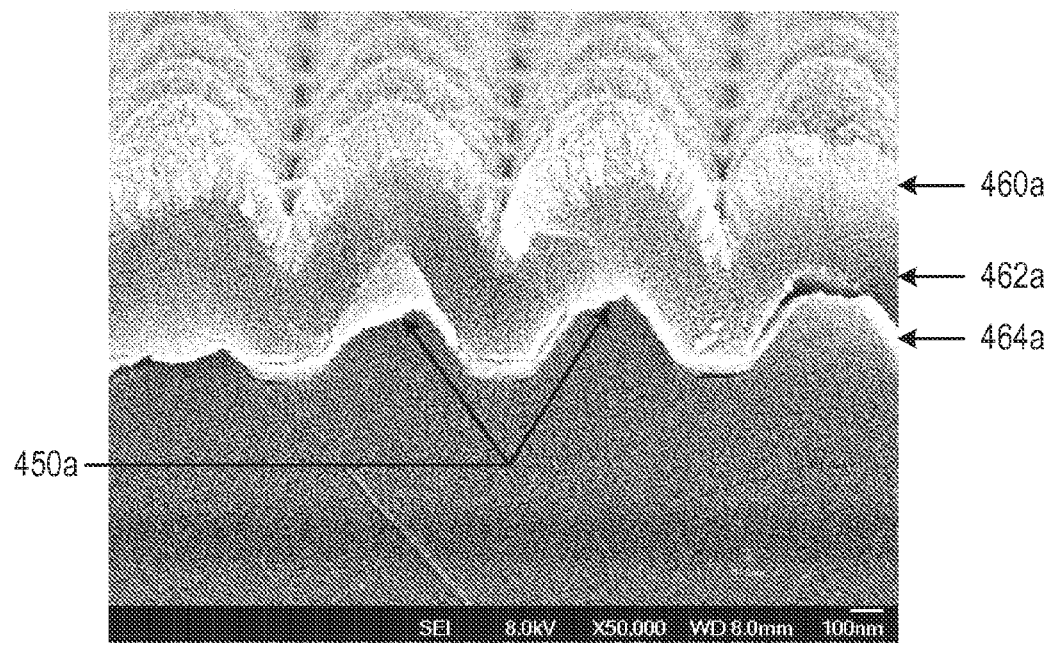
FIG. 23 shows a scanning electron micrograph of another nanopatterned thin film solar cell similar to the solar cell illustrated in FIG. 6.

A nanopatterned solar cell with pyramid nanostructures was produced using processes described herein and as further shown in FIGS. 21-23. An imprint template was first formed as shown in FIGS. 21A-D. A silicon wafer was first imprinted with a polymeric material, i.e., imprint resist, with an imprinted grid array 402 having a 650 nm pitch, as shown in FIG. 21A. The pattern was wet etched using KOH to etch pyramid nanostructures 404 into silicon having height and pitch dimensions of approximately 350 nm and 650 nm, respectively, as shown in FIG. 21B. The pattern was imprinted into resist on a glass substrate to form pyramid nanostructures 406 (FIG. 21C), followed by reactive ion etching (RIE) to transfer the pattern into the glass substrate, forming pyramid nanostructures 450 as shown in FIG. 21D. The process was then repeated to create the inverted pattern of pyramid nanostructures on a second glass substrate, which was then subjected to buffered oxide etching for approximately 1 minute to round the edges between the template surface and the inverted pyramid bases of the template, as has been previously described. The formed template was then used to form the solar cell shown in FIG. 23.

The solar cell of FIG. 22 was formed using a similar template formed as described above but having a height and pitch of approximately 180 nm and approximately 530 nm pitch. FIG. 22 shows a solar cell formed with pyramid nanostructures 450b having the above dimensions (approximately 180 nm and approximately 530 nm pitch) and which were dry etched into a glass substrate. This corresponds to a patterned surface with approximately 15% of the surface comprising the pyramid nanostructures. Ni was sputtered onto the patterned surface to form an adhesion layer of Ni approximately 10 nm. Ag was then sputtered onto the adhesion layer to form a first reflective conducting layer 464b of approximately 100 nm, followed by sputtering ZnO to form a buffer layer of ZnO approximately 40 nm over the Ag conducting layer. A layer of a-Si 462b was then deposited over the buffer layer by PECVD deposition of n-i-p a-Si to form n-i-p a-Si of approximately 19 nm n-layer, 160 nm i-layer and 12 nm p-layer. A second conductive layer 460b of transparent conductive oxide (TCO) was formed by sputtering indium tin oxide (ITO) over the a-Si layer.

FIG. 23 shows a second solar cell formed as above but using an imprint template producing pyramid nanostructures 464a having a height of approximately 350 nm and approximately 650 nm pitch, which corresponds to a patterned surface with approximately 50% of the surface comprising the pyramid nanostructures. First Ag conducting layer 464a, a-Si layer 462a, and ITO layer 460a were formed over the pattern as described above.

The solar cells of FIGS. 22 and 23 were compared to flat or planar solar cells, (i.e., substrates with no patterning), as well as solar cells containing random texturing. The random textured solar cells were created using randomly textured tin oxide as a TCO material for building the solar cell. The dimensions and remaining aspects of the solar cells (e.g, Ag layer, n-i-p a-Si layer, top TCO layer of indium tin oxide (ITO) were kept constant. The results are set forth in Table 1.

TABLE 1

| Cell | Voc | Jsc (mA/cm$^2$) | FF | PCE (%) |
| --- | --- | --- | --- | --- |
| Planar | 0.68 | 6.8 | 0.60 | 2.75 |
| Random Texture | 0.71 | 8.6 | 0.60 | 3.70 |
| Nanopatterned pyramids, 15% density | 0.68 | 10.5 | .06 | 4.37 |
| Nanopatterned pyramids, 50% density | 0.7 | 10.85 | 0.59 | 4.51 |

As can be seen, the pyramid nanopatterned solar cells show a dramatic improvement in power conversion efficiency (PCE) over conventional planar solar cells and randomly textured solar cells. Further, the density of the pyramid nanostructures can further yield an increase in PCE as the 50% solar cell (FIG. 23) outperforms the 15% solar cell (FIG. 22).

Further modifications and alternative embodiments of various aspects will be apparent to those skilled in the art in view of this description. For example and without limitation, the formation of nanostructures, and accompanying formation of front and back electrodes, a-Si deposition, and organic layer removal, are all adaptable to roll-to-roll processes in order to, e.g., reduce solar cell fabrication costs. Similarly, aspects provided herein may be applied to single a-Si solar cells as well as tandem solar cells, to thin film inorganic, thin film organic, thin film hybrid solar cells and the like. Aspects are also applicable to c-Si solar cells. Accordingly, this description is to be construed as illustrative only. It is to be understood that the forms shown and described herein are to be taken as examples of embodiments. Elements and materials may be substituted for those illustrated and described herein, parts and processes may be reversed, and certain features may be utilized independently, all as would be apparent to one skilled in the art after having the benefit of this description. Changes may be made in the elements described herein without departing from the spirit and scope as described in the following claims.

What is claimed is:

1. A method of producing a solar cell, the method comprising:
    providing a substrate;
    forming a patterned layer in direct contact with the substrate, the patterned layer including:
        i) a repeating pattern of pyramid nanostructures extending away from the substrate such that there is a distance between bases of directly adjacent pyramid nanostructures. and
        ii) a residual layer positioned between the pyramid nanostructures and the substrate, wherein the intersections between a surface of the residual layer and the bases of the pyramid nanostructures are rounded;
    depositing a first conducting material in direct contact with the patterned layer and coinciding with the repeating pattern of the pyramid nanostructures;
    depositing a semiconductor layer on the first conducting material, the semiconductor layer comprising, in an order of deposition, an amorphous silicon p-type layer, an amorphous silicon intrinsic layer, and an amorphous silicon n-type layer; and
    depositing a second conducting material in direct contact with the semiconductor layer, wherein the semiconductor layer and the second conducting material coincide with the repeating pattern of the pyramid nanostructures.

2. The method of claim 1, wherein an aspect ratio of the pyramid nanostructures is between 0.5 and 10.

3. The method of claim 1, wherein forming the patterned layer further includes forming the pyramid nanostructures to have a height between 100 nm and 2 μm and a pitch between 300 nm and 2 μm.

4. The method of claim 1, wherein forming the patterned layer further includes forming the pyramid nanostructures such that an angle between the surface and faces of the pyramid nanostructures is between 110° and 150°.

5. The method of claim 1, wherein forming the patterned layer further includes forming the pyramid nanostructures such that the distance between bases of the pyramid nanostructures is between greater than 0 and 500 nm.

6. The method of claim 1, further comprising forming a buffer layer between the first conducting material and the semiconductor layer.

7. The method of claim 1, further comprising roughening surfaces of the pyramid nanostructures.

8. The method of claim 1, wherein the residual layer has a thickness of less than 25 nm.

9. The method of claim 1, further comprising removing the residual layer.

10. The method of claim 9, wherein the residual layer is removed by VUV etching.

11. The method of claim 1, further comprising transferring the patterned layer to the substrate by wet etching.

12. The method of claim 11, wherein the wet etching increases a feature height and aspect ratio of the pyramid nanostructures.

13. The method of claim 1, wherein forming the patterned layer is a polymeric layer containing the repeating pattern of pyramid nano structures.

14. The method of claim 13, wherein the polymeric layer contains silicon, the method further comprising oxidizing a surface of the silicon-containing polymeric layer to form a glass top surface layer.

* * * * *

UNITED STATES PATENT AND TRADEMARK OFFICE
CERTIFICATE OF CORRECTION

PATENT NO. : 9,196,765 B2  
APPLICATION NO. : 14/716233  
DATED : November 24, 2015  
INVENTOR(S) : Shuqiang Yang et al.

Page 1 of 1

It is certified that error appears in the above-identified patent and that said Letters Patent is hereby corrected as shown below:

In the Claims

Column 17, line 31, in claim 1, delete "nanostructures." and insert -- nanostructures; --.

Column 18, line 10, in claim 3, before "a height" delete "have".

Column 18, line 38, in claim 13, delete "nano structures." and insert -- nanostructures. --.

Signed and Sealed this  
Twenty-second Day of March, 2016

Michelle K. Lee  
*Director of the United States Patent and Trademark Office*